United States Patent
Chen et al.

(10) Patent No.: US 11,664,280 B2
(45) Date of Patent: May 30, 2023

(54) SEMICONDUCTOR DEVICES WITH BACKSIDE AIR GAP DIELECTRIC

(71) Applicant: Taiwan Semiconductor Manufacturing Co., Ltd., Hsinchu (TW)

(72) Inventors: Chun-Yuan Chen, Hsinchu (TW); Huan-Chieh Su, Changhua County (TW); Cheng-Chi Chuang, New Taipei (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/873,903

(22) Filed: Jul. 26, 2022

(65) Prior Publication Data
US 2022/0367284 A1    Nov. 17, 2022

Related U.S. Application Data

(62) Division of application No. 16/888,217, filed on May 29, 2020, now Pat. No. 11,443,987.

(51) Int. Cl.
*H01L 27/088* (2006.01)
*H01L 21/8234* (2006.01)
(Continued)

(52) U.S. Cl.
CPC ........ *H01L 21/823475* (2013.01); *H01L 21/02274* (2013.01); *H01L 21/31053* (2013.01);
(Continued)

(58) Field of Classification Search
None
See application file for complete search history.

(56) References Cited

U.S. PATENT DOCUMENTS 8,772,109 B2  7/2014  Colinge
8,785,285 B2  7/2014  Tsai et al.
(Continued)

FOREIGN PATENT DOCUMENTS

CN    1708859 A     12/2005
KR    20050089221 A  9/2005
(Continued)

OTHER PUBLICATIONS

Lou, Qiaowei, et al., "Optical Emission Spectroscopic Studies and Comparisons of CH3F/CO2 and CH3F/O2 Inductively Coupled Plasmas", Plasma Processing Laboratory, Department of Chemical and Biomolecular Engineering University of Houston, Manuscript # JVSTA-A-14-332.
(Continued)

*Primary Examiner* — Jack S Chen
(74) *Attorney, Agent, or Firm* — Haynes and Boone, LLP

(57) ABSTRACT

A semiconductor structure has a frontside and a backside. The semiconductor structure includes an isolation structure at the backside; one or more transistors at the frontside, wherein the one or more transistors have source/drain electrodes; two metal plugs through the isolation structure and contacting two of the source/drain electrodes from the backside, wherein the two metal plugs and the isolation structure form sidewalls of a trench; and a dielectric liner on the sidewalls of the trench, wherein the dielectric liner partially or fully surrounds an air gap within the trench.

20 Claims, 27 Drawing Sheets

(51) Int. Cl.
*H01L 23/528* (2006.01)
*H01L 21/764* (2006.01)
*H01L 21/3105* (2006.01)
*H01L 21/02* (2006.01)
*H01L 29/417* (2006.01)

(52) U.S. Cl.
CPC .... *H01L 21/764* (2013.01); *H01L 21/823431* (2013.01); *H01L 23/528* (2013.01); *H01L 27/0886* (2013.01); *H01L 29/41791* (2013.01)

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,993,380 B2 | 3/2015 | Hou et al. |
| 9,105,490 B2 | 8/2015 | Wang et al. |
| 9,236,267 B2 | 1/2016 | De et al. |
| 9,236,300 B2 | 1/2016 | Liaw |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,520,482 B1 | 12/2016 | Chang et al. |
| 9,576,814 B2 | 2/2017 | Wu et al. |
| 9,704,835 B2 | 7/2017 | Feng et al. |
| 9,711,555 B2 | 7/2017 | Lin et al. |
| 2015/0037980 A1 | 2/2015 | Rha et al. |
| 2015/0287628 A1 | 10/2015 | You et al. |
| 2016/0307842 A1 | 10/2016 | Baek |
| 2017/0133414 A1 | 5/2017 | Chiang |
| 2017/0213836 A1 | 7/2017 | Zhang |
| 2019/0157310 A1 | 5/2019 | Glass |
| 2019/0164882 A1 | 5/2019 | Chen et al. |
| 2021/0375691 A1 | 12/2021 | Chen |
| 2021/0391431 A1 | 12/2021 | Huang |
| 2022/0367284 A1* | 11/2022 | Chen .................. H01L 21/31053 |

FOREIGN PATENT DOCUMENTS

| | | |
|---|---|---|
| KR | 20100120316 A | 11/2010 |
| KR | 20160122364 A | 10/2016 |
| KR | 20190015269 A | 2/2019 |

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

Chen, Hsin-Ping, et al., "Semiconductor Device with Conductors Embedded in a Substrate", U.S. Appl. No. 16/751,158, filed Jan. 24, 2020, Assignee: Taiwan Semiconductor Manufacturing Co., Ltd., 29 pages specification, 19 pages drawings.

* cited by examiner

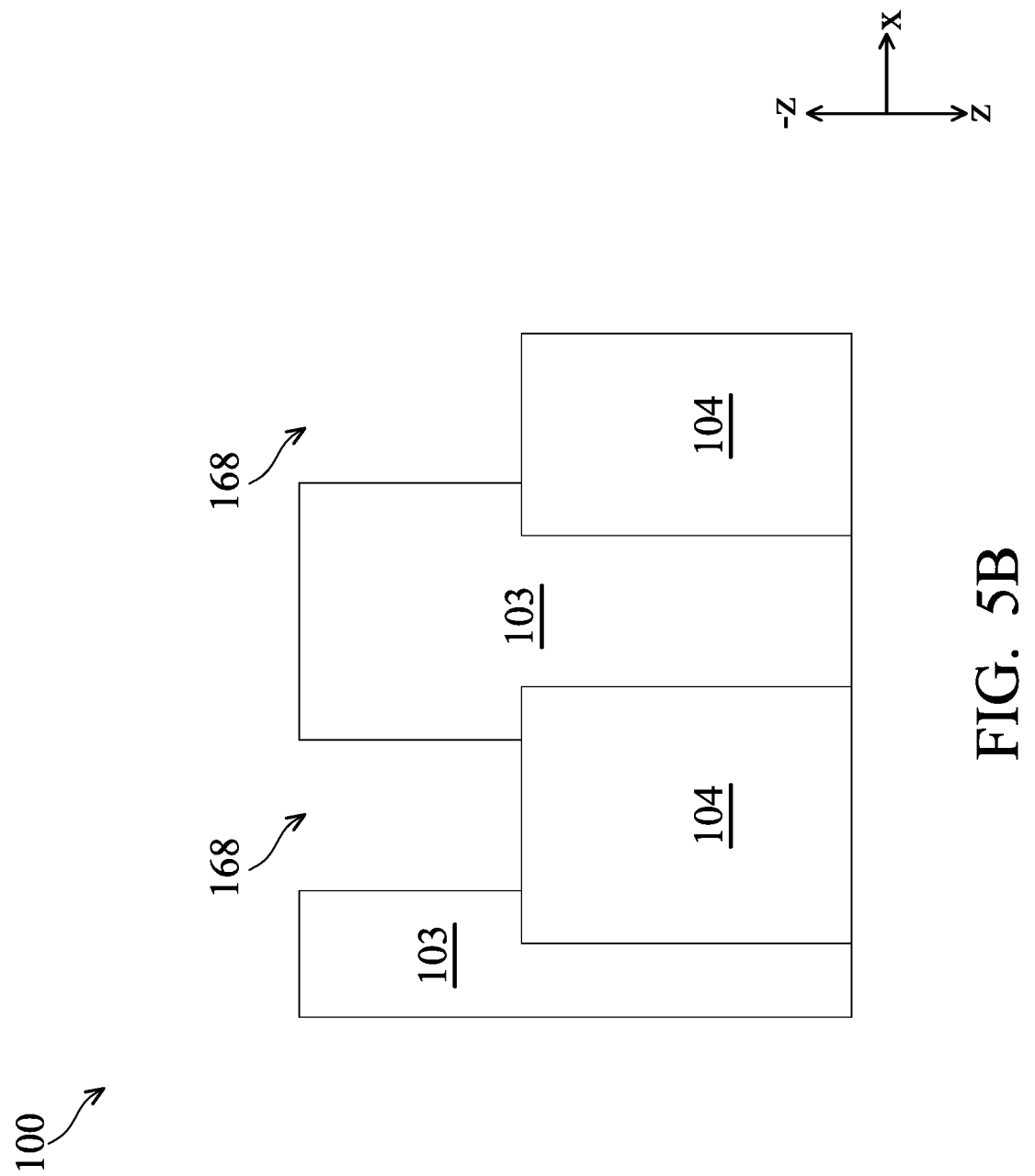

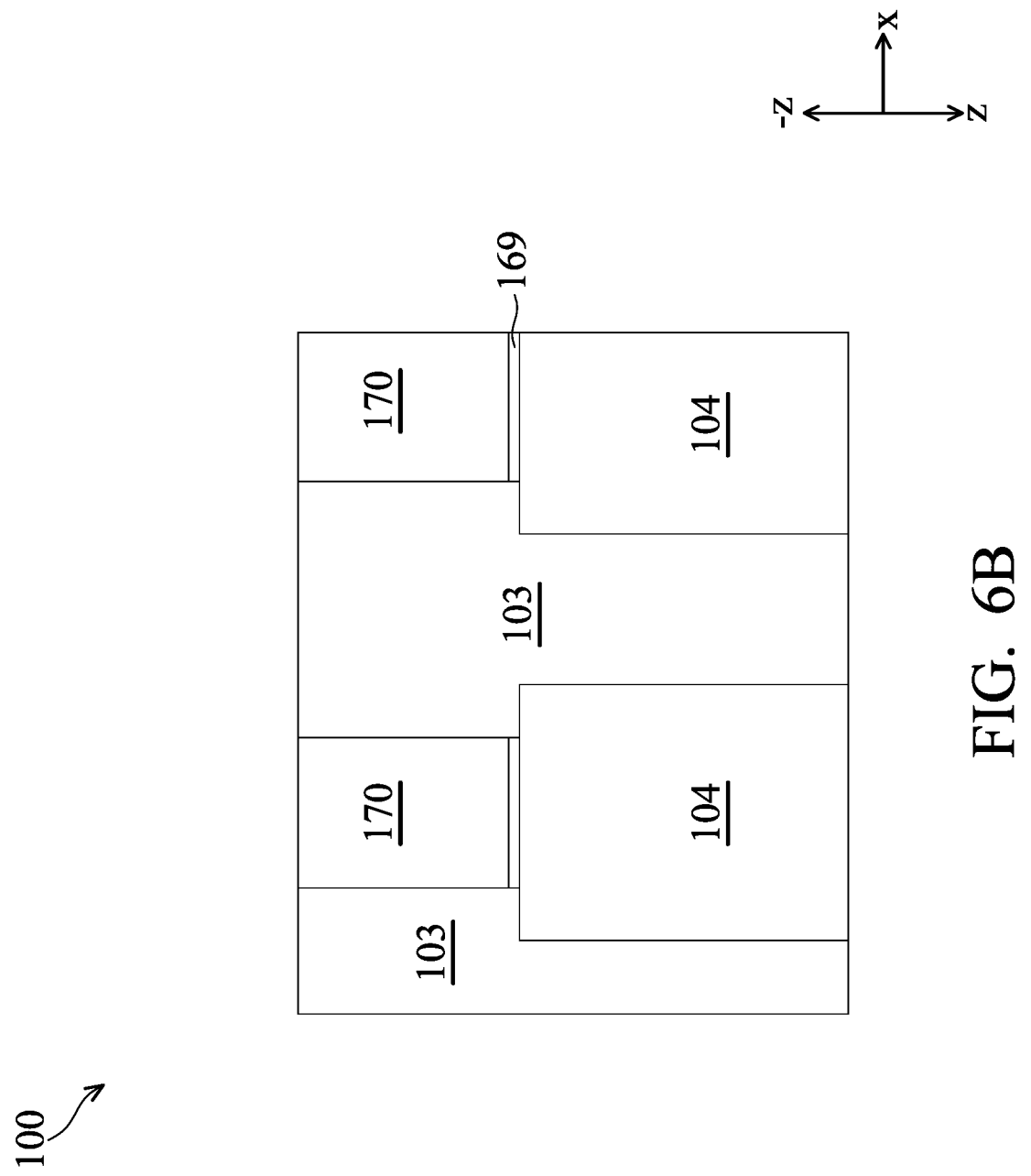

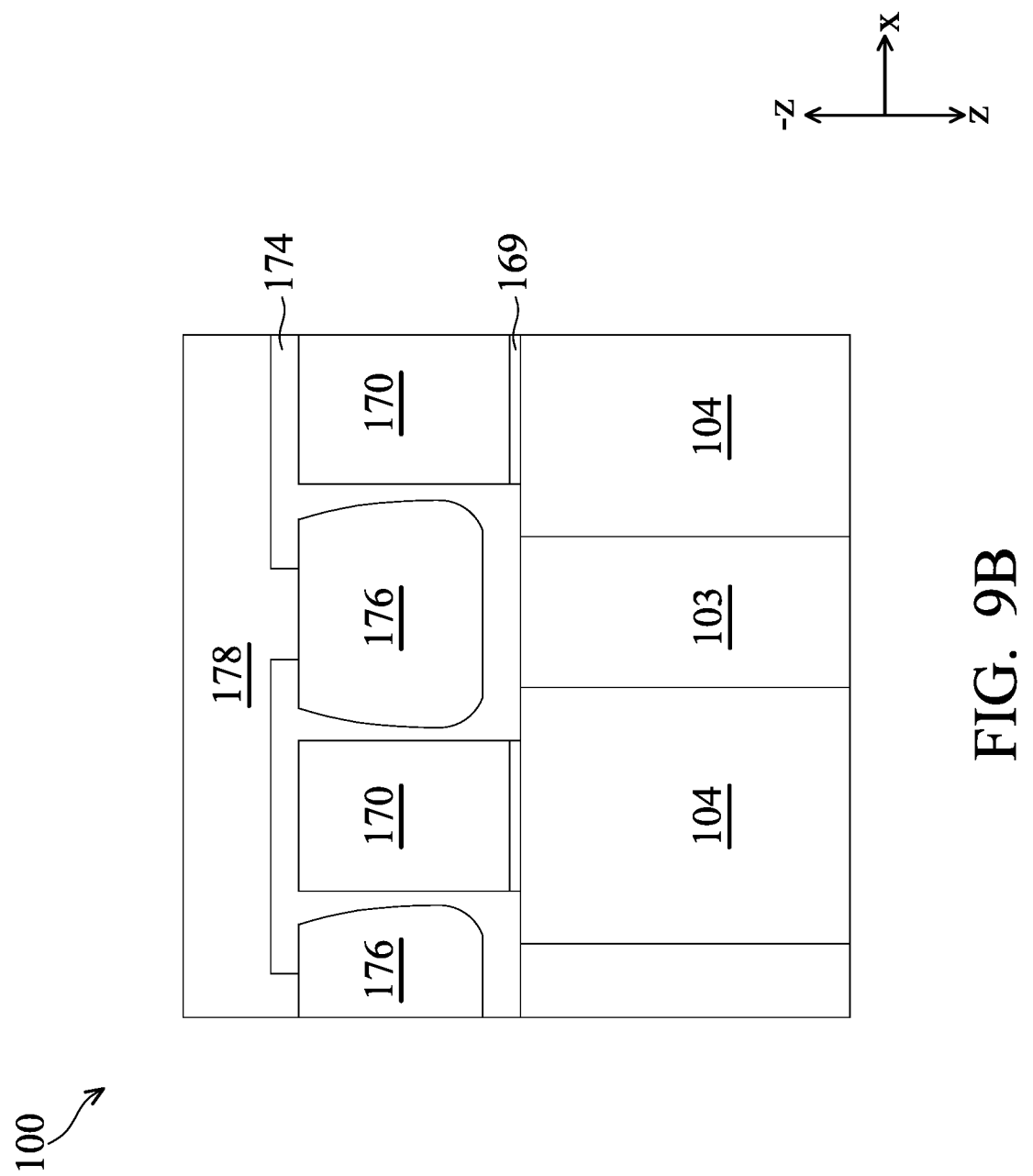

SEMICONDUCTOR DEVICES WITH BACKSIDE AIR GAP DIELECTRIC

PRIORITY

This is a divisional of U.S. patent application Ser. No. 16/888,217, filed May 29, 2020, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvements. One area of improvements is how to reduce stray capacitance among features of field effect transistors.

It is generally desirable to reduce stray capacitance between metal features, such as metal lines and/or metal plugs, in order to increase switching speed, decrease switching power consumption, and/or decrease coupling noise of the circuits. Certain low-k materials have been suggested as insulator materials to reduce stray capacitance. However, as semiconductor technology progresses to smaller geometries, the distances between the metal features are further reduced, which increases stray capacitance. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2D-1 and 2E-1 illustrate cross-sectional views of a portion of the semiconductor device in FIG. 2C along the A-A line and the B-B line in FIG. 2C, respectively, according to another embodiment.

FIGS. 5B, 6B, 7B, 8B, 9B, 10B, 11B, and 11B-1 illustrate cross-sectional views of a portion of a semiconductor device along the Cut-1 line in FIGS. 5A, 6A, 7A, 8A, 9A, 10A, and 11A respectively, according to some embodiments.

DETAILED DESCRIPTION

Figure 1A:
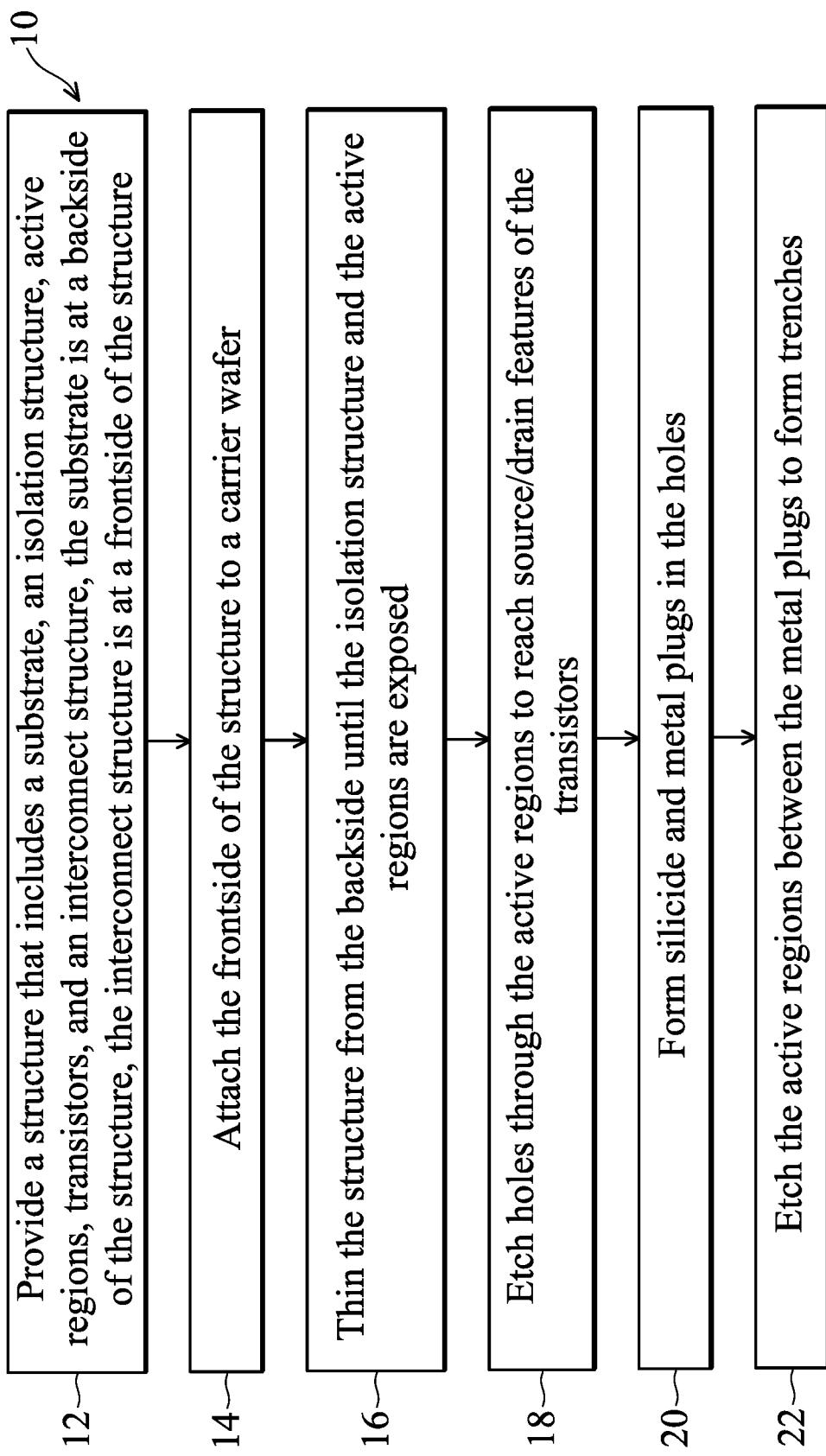
FIGS. 1A and 1B show a flow chart of a method of forming a semiconductor device with air gap on a backside of a wafer, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure generally relates to a semiconductor fabrication process and the structure thereof. More particularly, the present disclosure relates to fabricating dielectric layer(s) and metal layer(s) on a backside of a structure (such as a wafer) where devices (such as transistors) have been fabricated on a frontside of the structure. As semiconductor technology progresses to smaller geometries, it is desirable to move some of the connectivity layers to the backside of a wafer, such as power rails connecting to transistors' source and/or drain (source/drain) features. This will free up some area at the frontside of the wafer and further increase the device integration. This also presents new challenges. One of the challenges is how to deal with the stray capacitance (or coupling capacitance) between the conductors on the backside, such as metal plugs that reach into the source/drain features from the backside. The small distance between those conductors could mean large stray capacitance if not dealt with properly. According to some embodiments of the present disclosure, the backside dielectric layer(s) are provided with air gaps for reducing stray capacitance and increasing isolation between conductors. These and other aspects of the present disclosure are further described by referring to the accompanied figures.

Figure 1B:
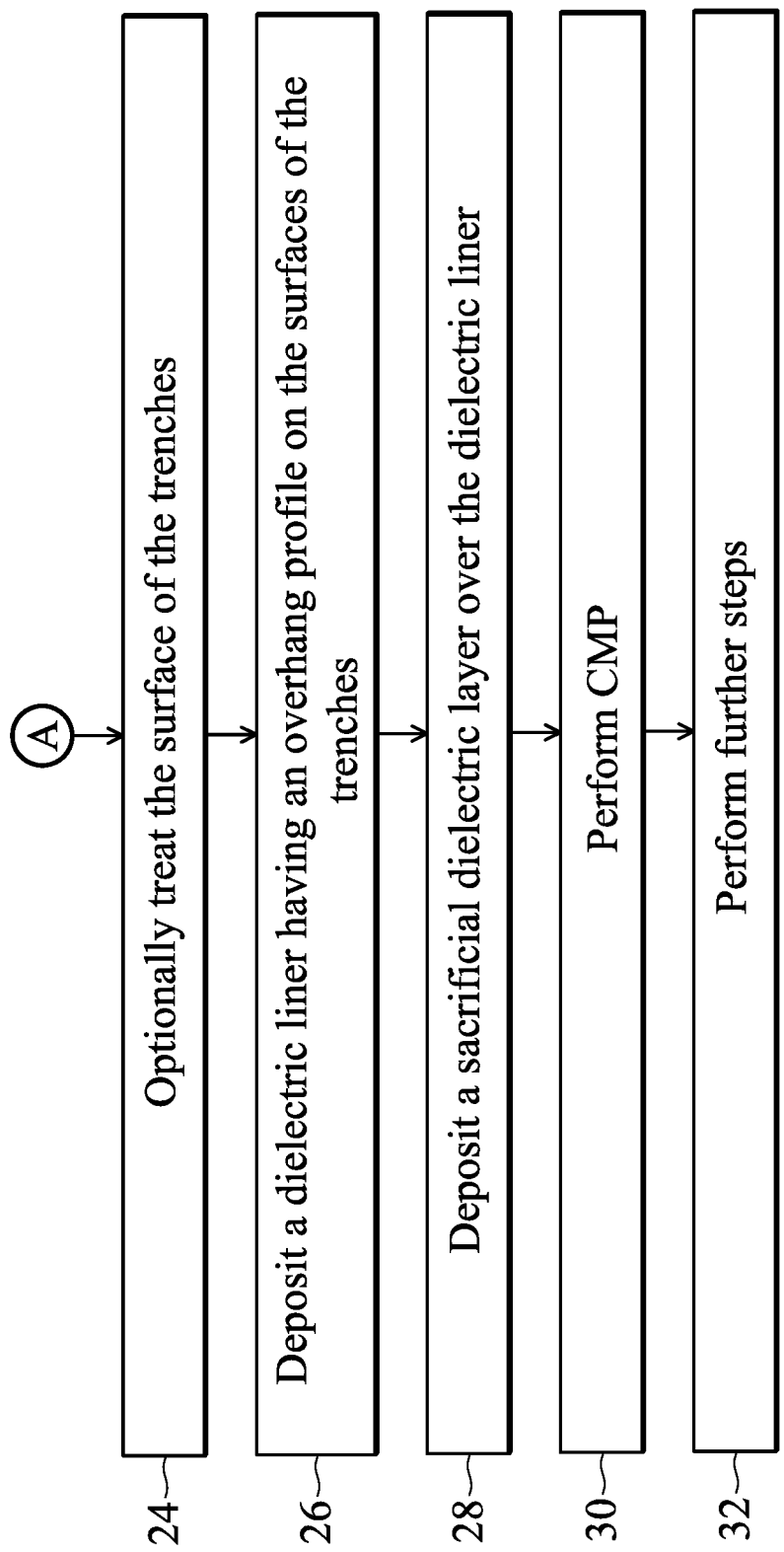

FIGS. 1A and 1B are a flow chart of a method 10 for fabricating a semiconductor device according to various aspects of the present disclosure. Additional processing is contemplated by the present disclosure. Additional operations can be provided before, during, and after method 10, and some of the operations described can be moved, replaced, or eliminated for additional embodiments of method 10.

Method 10 is described below in conjunction with FIG. 2A through FIG. 11B-1 that illustrate various perspective and cross-sectional views of a semiconductor device (or a semiconductor structure) 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 11B-1 have been simplified for the sake of clarity to better understand the inventive concepts of the present disclosure. Additional features can be added in the device 100, and some of the features described below can be replaced, modified, or eliminated in other embodiments of the device 100.

Figure 2A:
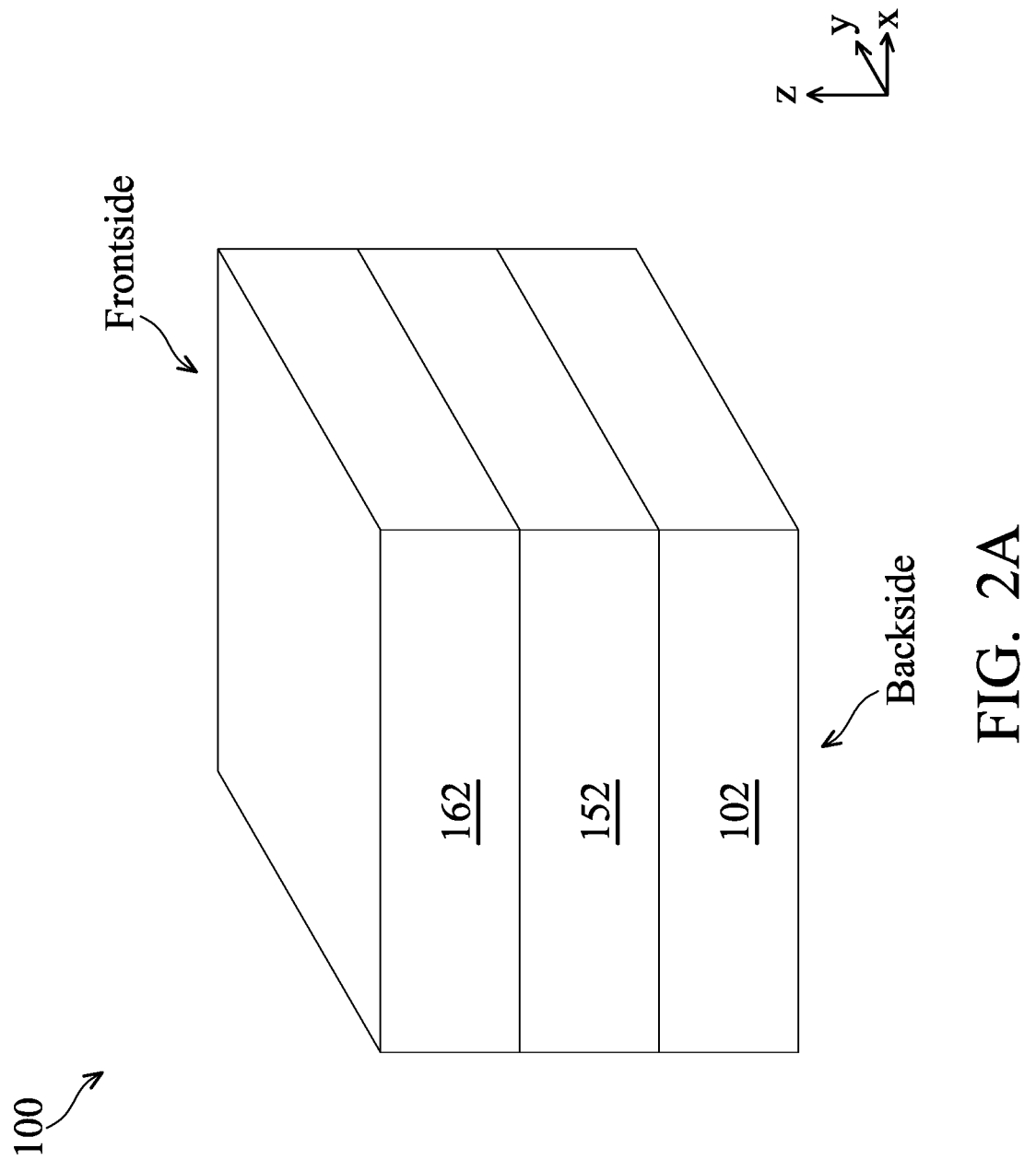
FIGS. 2A and 2B illustrate a perspective view and a cross-sectional view of a portion of a semiconductor device, according to some embodiments, in an intermediate step of fabrication according to an embodiment of the method of FIGS. 1A and 1B.
Figure 2B:
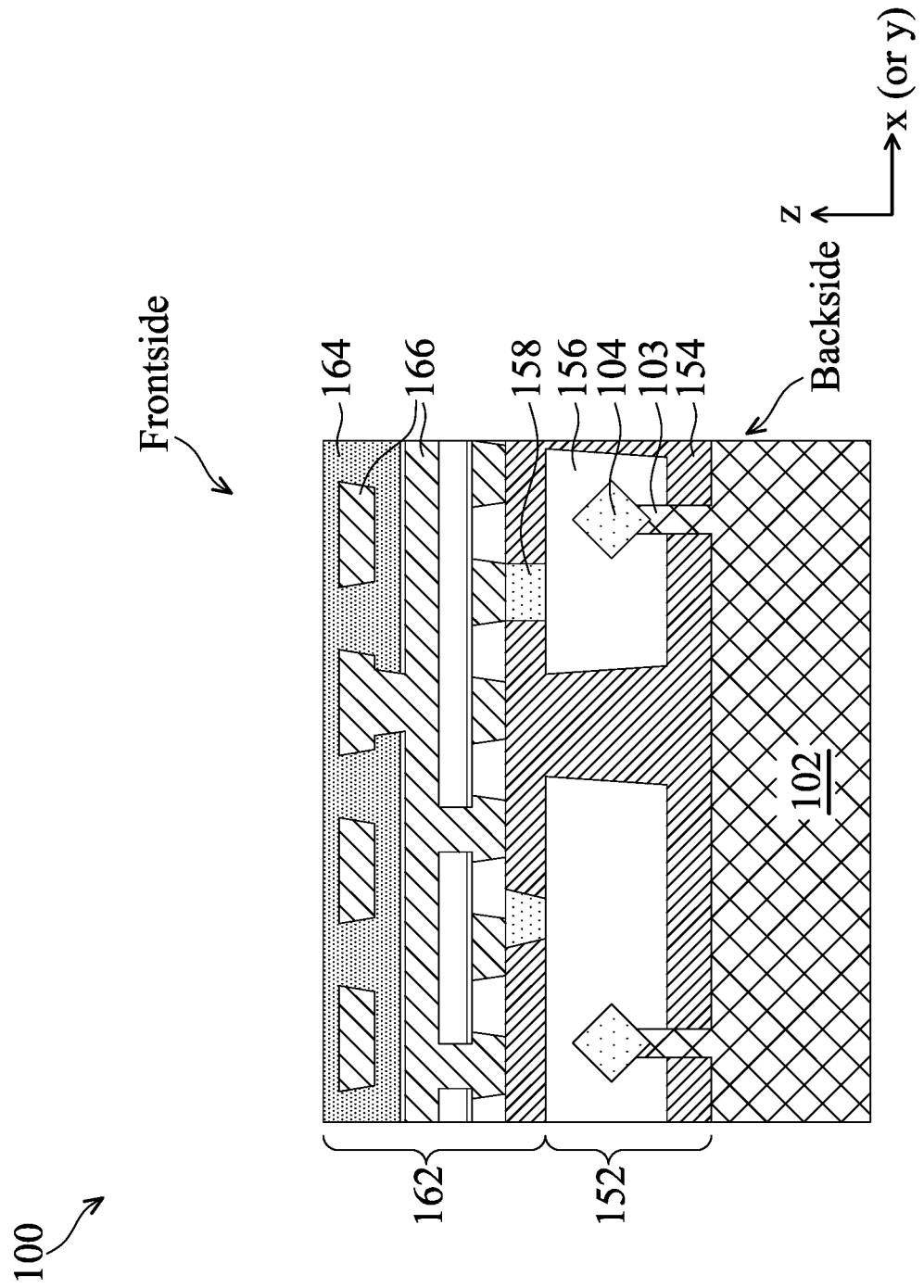

At operation 12, the method 10 (FIG. 1A) provides a structure (or a workpiece) of the device 100, an embodiment of which is illustrated in FIGS. 2A and 2B. Particularly, FIG. 2A illustrates a perspective view of a portion of the device 100 and FIG. 2B illustrates a cross-sectional view of a portion of the device 100, according to an embodiment. The device 100 includes a substrate 102, a device layer 152 over the substrate 102, and an interconnect structure (or a multilayer interconnect) 162 over the device layer 152. The device 100 may include other layers or features not shown in FIG. 2A, such as a passivation layer over the interconnect structure 162. The substrate 102 is at a backside of the device 100, and the interconnect structure 162 is at a frontside of device 100. In other words, the substrate 102, the device layer 152, and the interconnect structure 162 are disposed one over another from the backside to the frontside of the device 100.

The substrate 102 is a bulk silicon (Si) substrate in the present embodiment, such as a silicon wafer. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In some embodiments, the substrate 102 may include silicon on insulator (SOI) substrate, be strained and/or stressed for performance enhancement, include epitaxial regions, doped regions, and/or include other suitable features and layers.

The device layer 152 includes semiconductor active regions (such as semiconductor fins), and various active devices (e.g., transistors) built in or on the semiconductor active regions. The device layer 152 may also include passive devices such as capacitors, resistors, and inductors. The device layer 152 further includes local interconnects, isolation structures, and other structures. In the embodiment shown in FIG. 2B, the device layer 152 includes semiconductor fins (or fins) 103 that extend upwardly from the substrate 102, epitaxial features 104 over the semiconductor fins 103, and dielectric isolation features 154 between the semiconductor active regions. The epitaxial features 104 may be source or drain (S/D) electrodes of transistors. Thus, they are also referred to as S/D features 104. The semiconductor fins 103 may include silicon or other suitable semiconductor materials such as silicon germanium. The device layer 152 also includes conductors 156 and 158 (such as local interconnects, vias, and/or plugs) that provide connectivity to the S/D electrodes of the transistors, as well as gate electrodes though not shown in this figure. Some of the conductors 158 are connected to the interconnect structure 162. The conductors 156 and 158 may comprise copper, tungsten, ruthenium, cobalt, or other suitable materials.

The interconnect structure 162 is over the device layer 152 and includes conductors 166 (such as metal lines or metal wires and vias) embedded in one or more dielectric layers 164. The conductors 166 provide connectivity to the devices in the device layer 152. The conductors 166 may also provide power rails and ground planes for the device 100. The conductors 166 may comprise copper, aluminum, or other suitable materials, and may be formed using single damascene process, dual damascene process, or other suitable processes. The dielectric layers 164 may comprise silicon nitride, silicon oxynitride, silicon nitride with oxygen (O) or carbon (C) elements, tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

Figure 2C:
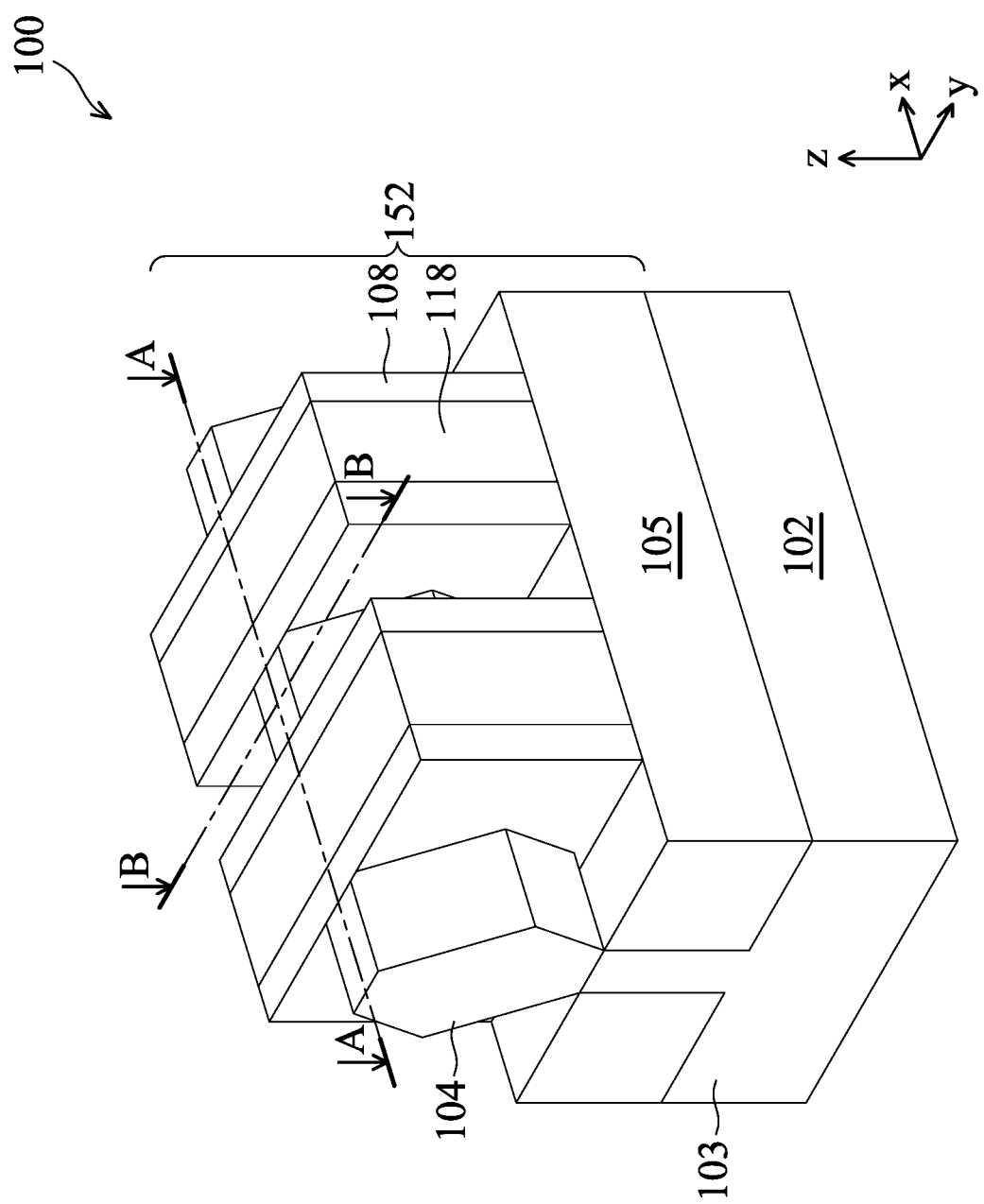
FIG. 2C illustrates a perspective view of a portion of the semiconductor device in FIG. 2A, according to some embodiments.
Figure 2D:
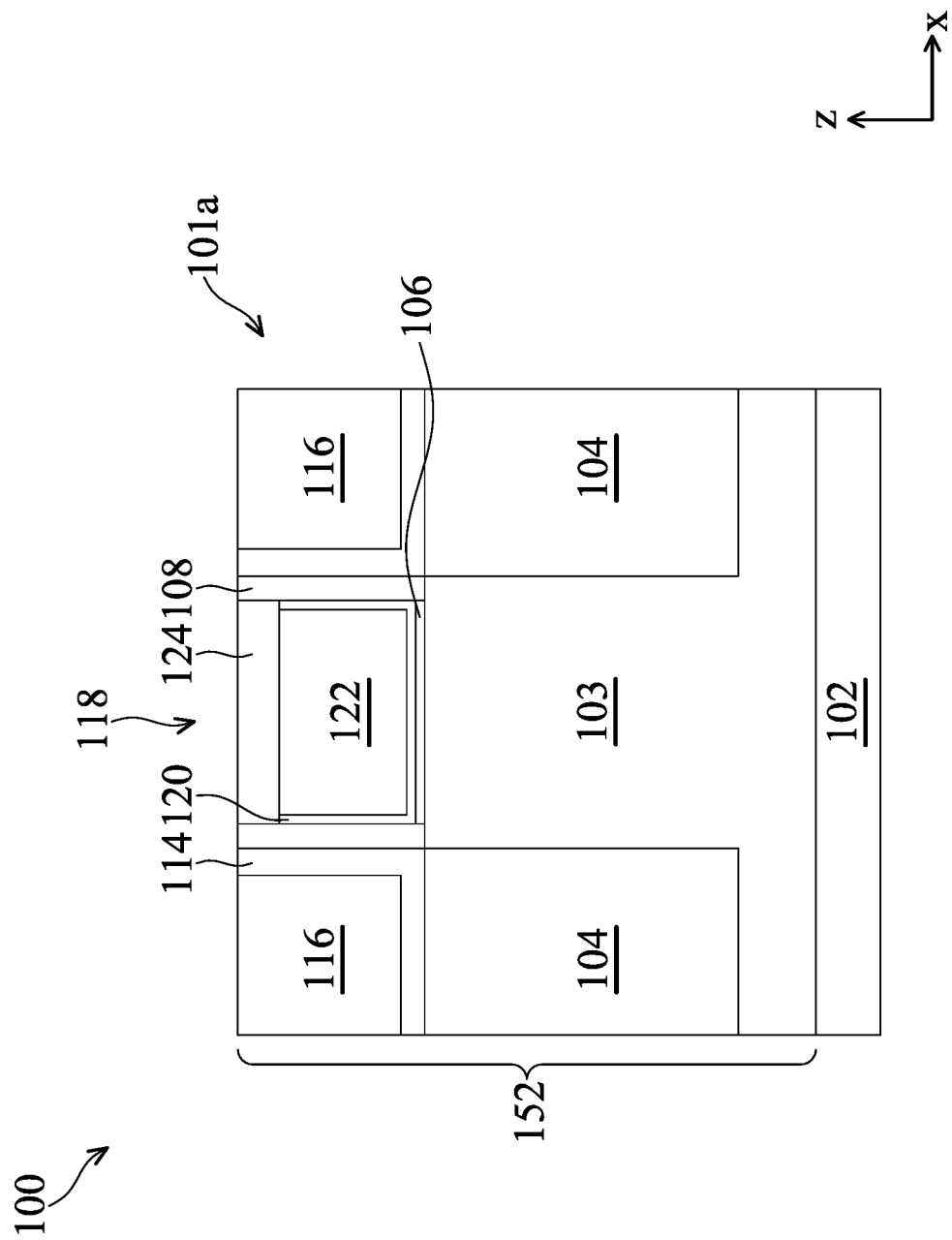
FIGS. 2D and 2E illustrate cross-sectional views of a portion of the semiconductor device in FIG. 2C along the A-A line and the B-B line in FIG. 2C, respectively, according to an embodiment.
Figures 1, 2D:
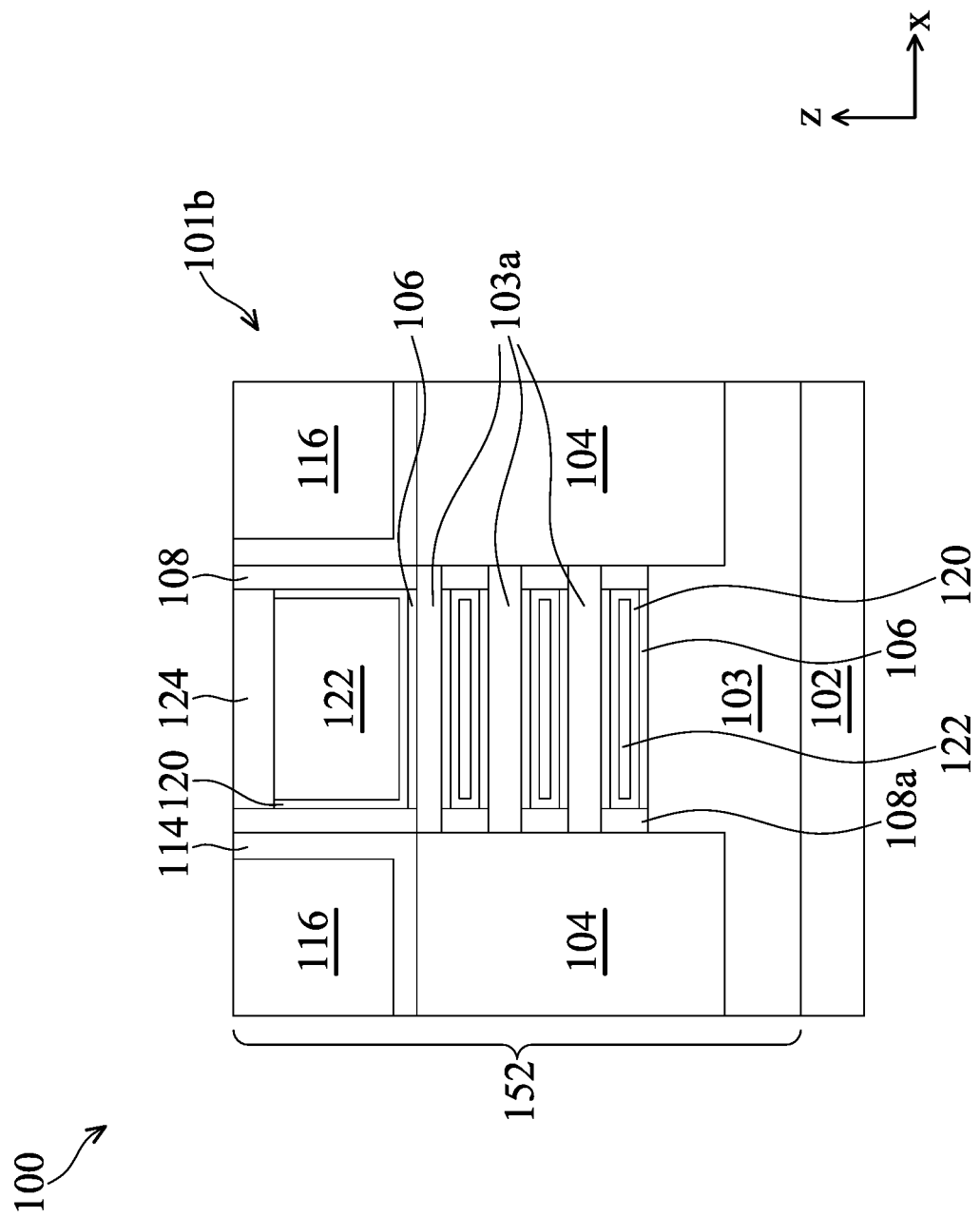
Figure 2E:
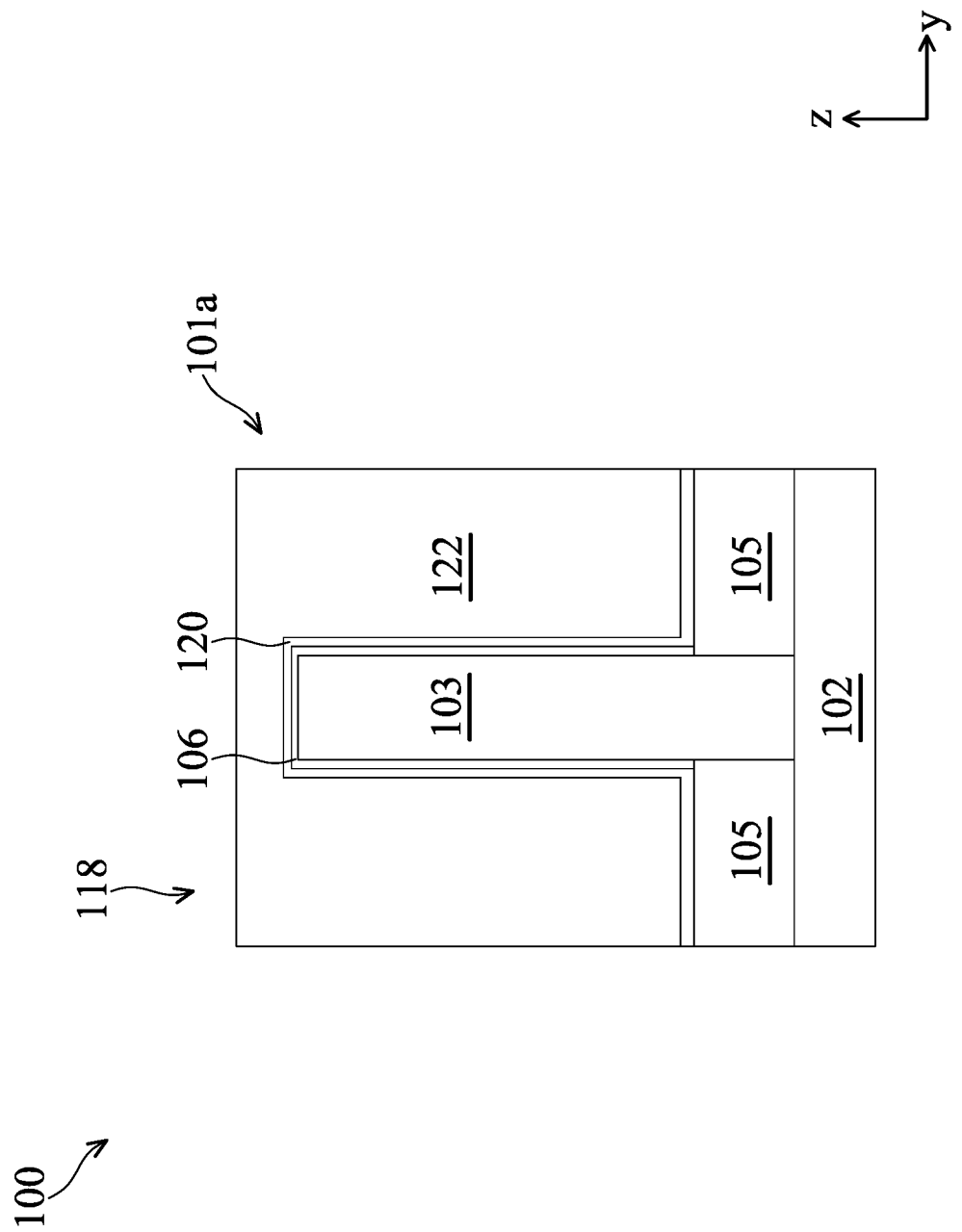
Figures 1, 2E:
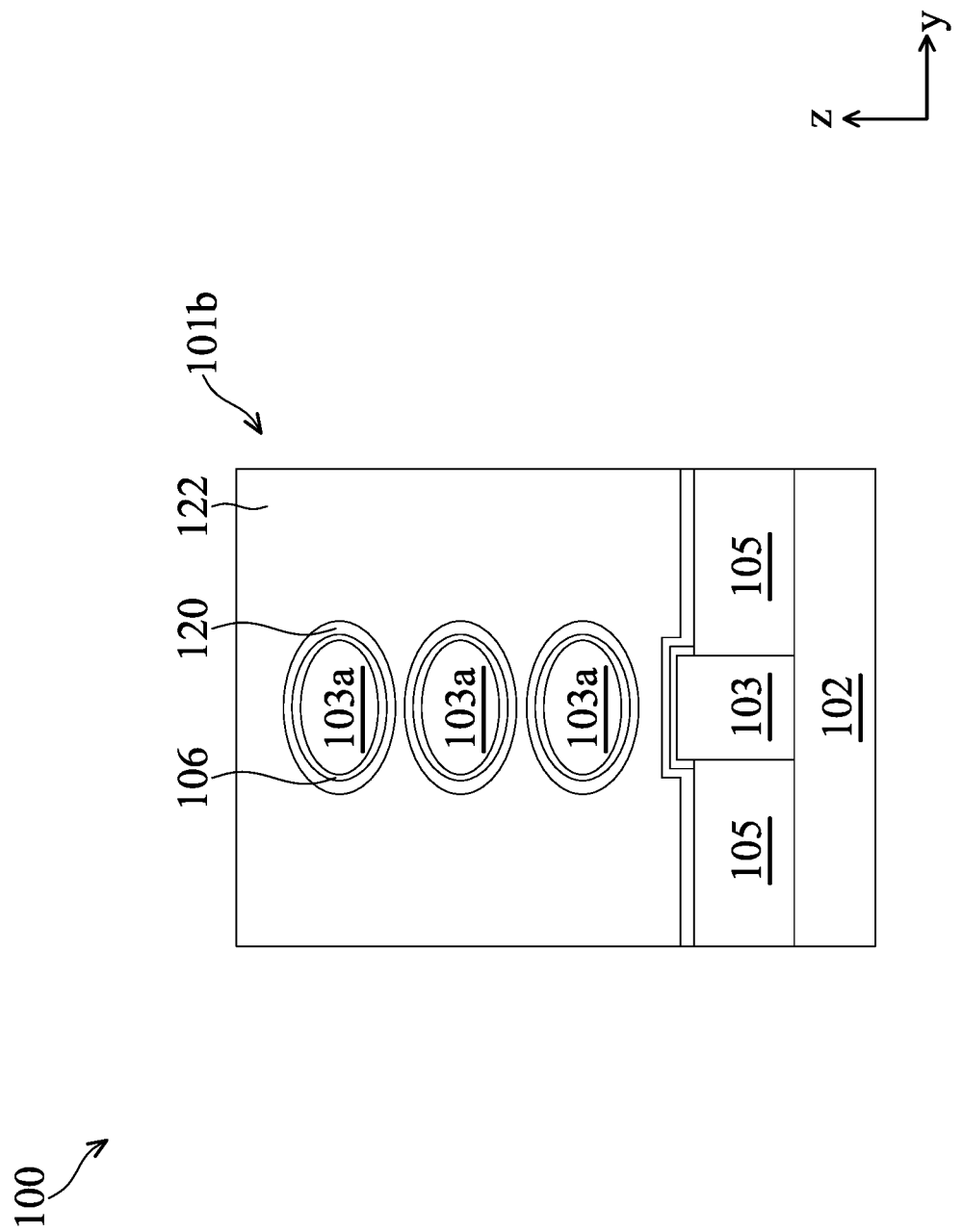

FIG. 2C illustrates a perspective view of a portion of the device 100 according to an embodiment, which includes a semiconductor fin 103 and a gate stack 118. The fin 103 is oriented lengthwise generally along the "x" direction, and the gate stack 118 is oriented lengthwise generally along the "y" direction perpendicular to the "x" direction. FIG. 2D illustrates a cross-sectional view of a portion of the device 100 along the A-A line in FIG. 2C according to an embodiment which is cut parallel to and through the fin 103. FIG. 2E illustrates a cross-sectional view of a portion of the device 100 along the B-B line in FIG. 2C according to an embodiment, which is cut parallel to and through the gate stack 118. The transistor illustrated in the embodiment of FIGS. 2D and 2E is a FinFET 101a. FIGS. 2D-1 and 2E-1 illustrate cross-sectional views of a portion of the device 100 along the A-A line and the B-B line in FIG. 2C, respectively, according to another embodiment, where the transistor is a gate-all-around (GAA) FET 101b. The device 100 may include any number of fins 103, any number of gate stacks 118, any number of FinFETs and/or GAA FETs, and other types of devices, in various embodiments.

Referring to FIGS. 2C-2E collectively, the device 100 includes the substrate 102, over which the fin 103 and the gate stack 118 are formed. The device 100 includes an isolation structure 105 (which is part of the isolation structure 154 in FIG. 2B) for isolating the fin 103 from other active regions or fins. The fin 103 extends from the substrate 102 and above the isolation structure 105. The gate stack 118 is disposed above the isolation structure 105 and on three sides of the fin 103. The device 100 further includes gate spacers 108 on sidewalls of the gate stack 118. The epitaxial S/D features 104 are disposed on top of the fin 103 and on both sides of the gate stack 118.

The fin 103 may include one or more layers of semiconductor materials such as silicon or silicon germanium. The fin 103 may be patterned by any suitable method. For example, the fin 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fin 103. For example, the masking element may be used for etching recesses into semiconductor layers over or in the substrate 102, leaving the fin 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fin 103 may be suitable.

The S/D features 104 include epitaxially grown semiconductor materials such as epitaxially grown silicon, germanium, or silicon germanium. The S/D features 104 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D features 104 may be doped with n-type dopants and/or p-type dopants. In some embodiments, for n-type transistors, the S/D features 104 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D features 104 include silicon germanium or germanium, and can be doped with boron, other p-type dopant, or combinations thereof (for example, forming Si:Ge:B epitaxial S/D features). The S/D features 104 may include multiple epitaxial semiconductor layers having different levels of dopant density. In some embodiments, annealing processes (e.g., rapid thermal annealing (RTA) and/or laser annealing) are performed to activate dopants in the epitaxial S/D features 104.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers (e.g., silicon nitride) on surfaces of the substrate 102 and the fin 103 and a main isolating layer (e.g., silicon dioxide) over the one or more liner layers.

In the present embodiment, the gate stack 118 includes a gate dielectric layer 120 and a gate electrode layer 122 over the gate dielectric layer 120. The gate dielectric layer 120 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 120 may be formed by chemical oxidation, thermal oxidation, atomic layer deposition (ALD), chemical vapor deposition (CVD), and/or other suitable methods. In the present embodiment, the gate stack 118 further includes an interfacial layer 106 between the gate dielectric layer 120 and the fin 103. The interfacial layer 106 may include silicon dioxide, silicon oxynitride, or other suitable materials. In some embodiments, the gate electrode layer 122 includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 122 may be formed by CVD, PVD, plating, and/or other suitable processes. Since the gate stack 118 includes a high-k dielectric layer and metal layer(s), it is also referred to as a high-k metal gate.

Each of the gate spacers 108 may be a single layer or multi-layer structure. In some embodiments, the spacers 108 include a dielectric material, such as silicon oxide ($SiO_2$), silicon nitride ($Si_3N_4$), silicon oxynitride (SiON), other dielectric material, or combination thereof. In an example, the spacers 108 are formed by deposition and etching (e.g., anisotropic etching) processes. In some embodiment, the gate spacers 108 include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s).

In the present embodiment, the device 100 further includes a gate cap 124 over the gate stack 118. The gate cap 124 may include a material such as $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other material(s). The gate cap 124 may be formed by recessing the gate stack 118 between the opposing gate spacers 108; depositing one or more materials over the recessed gate stack 118; and performing a CMP process to the one or more materials. The gate cap 124 may be deposited by atomic layer deposition (ALD), CVD, and/or other suitable methods.

The device 100 further includes a contact etch stop layer (CESL 114) and an inter-layer dielectric (ILD) layer 116, which are part of the isolation structure 154 in FIG. 2B. The CESL 114 is disposed over sidewalls of the spacers 108 and the S/D features 104. The ILD layer 116 is disposed over the CESL 114. The CESL 114 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 116 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 116 may be formed by PECVD (plasma enhanced CVD), FCVD (flowable CVD), or other suitable methods.

In some embodiment such as shown in FIGS. 2D-1 and 2E-1, the device 100 includes gate-all-around transistors such as nanosheet FETs or nanowire FETs. Most of the features in FIGS. 2D-1 and 2E-1 are the same as or similar to those in FIGS. 2D and 2E with like reference numerals denoting like features among the figures. Referring to FIGS. 2D-1 and 2E-1, in this embodiment, the device 100 further includes multiple layers 103a of semiconductor materials (such as silicon) that are vertically stacked over the substrate 102 (along the "z" direction) and horizontally connect the S/D features 104. The layers 103a are channel layers of the transistor and may be considered as part of the fin 103. The layers 103a may be in the shape of rods, bars, sheets, or other shapes in various embodiments. Portions of the gate stack 118 wrap around each of the multiple layers 103a. The device 100 further includes inner spacers 108a horizontally between the S/D features 104 and the portions of the gate stack 118 and vertically between the layers 103a. In some embodiment, the inner spacers 108a include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s).

Figure 3:
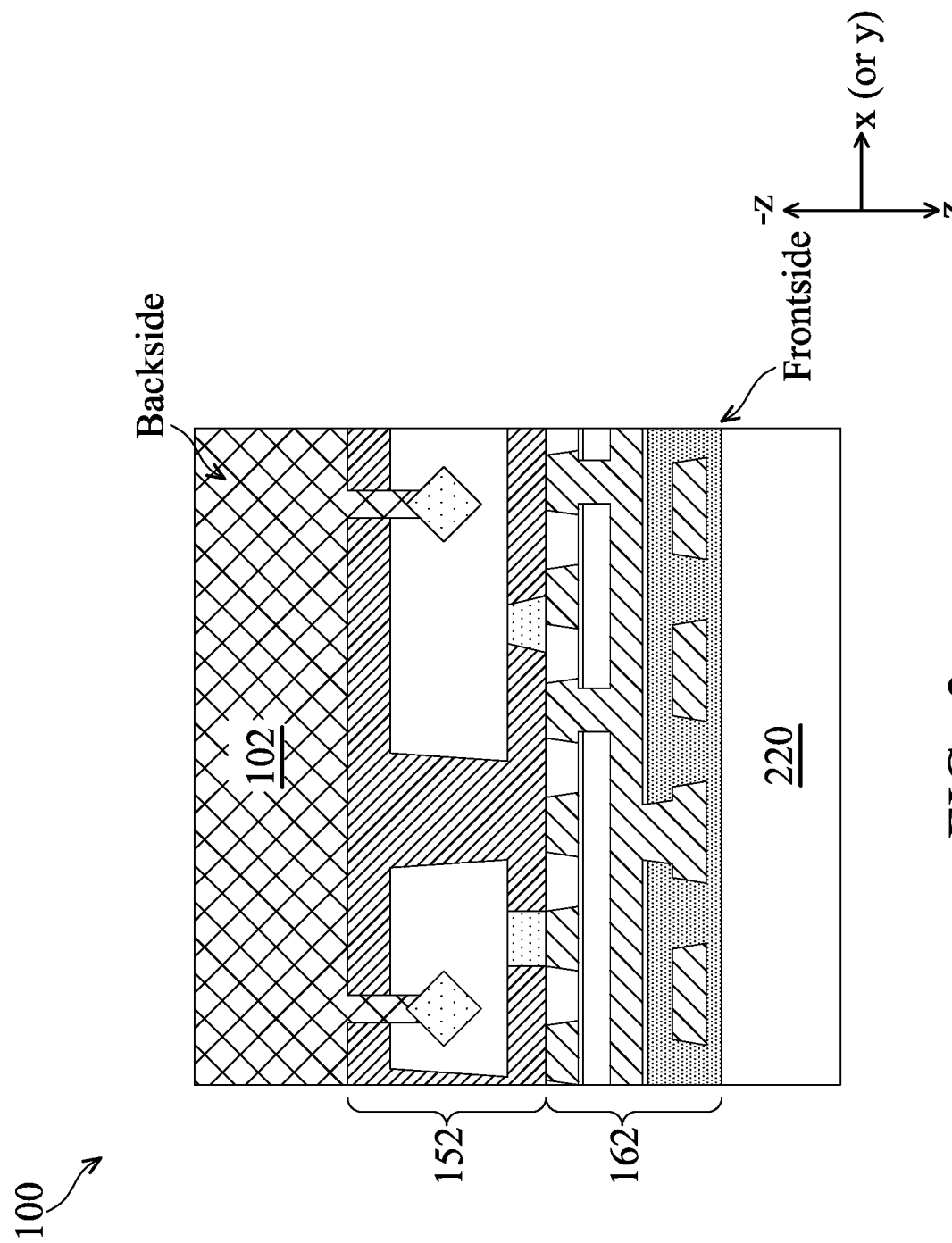
FIG. 3 illustrates a cross-sectional view of a portion of the semiconductor device of FIG. 2A in an intermediate step of fabrication according to an embodiment of the method of FIGS. 1A and 1B.

At operation 14, the method 10 (FIG. 1A) attaching the frontside of the device 100 to a carrier substrate 220, such as shown in FIG. 3. This makes the device 100 accessible from the backside of the device 100 for further processing. The operation 14 may use any suitable attaching processes, such as direct bonding, hybrid bonding, using adhesive, or other bonding methods. The operation 14 may further include alignment, annealing, and/or other processes. The carrier substrate 220 may be a silicon wafer in some embodiment. In FIG. 3 (as well as in other figures to be described below), the "z" direction points from the backside of the device 100 to the frontside of the device 100, while the "−z" direction points from the frontside of the device 100 to the backside of the device 100.

Figure 4:
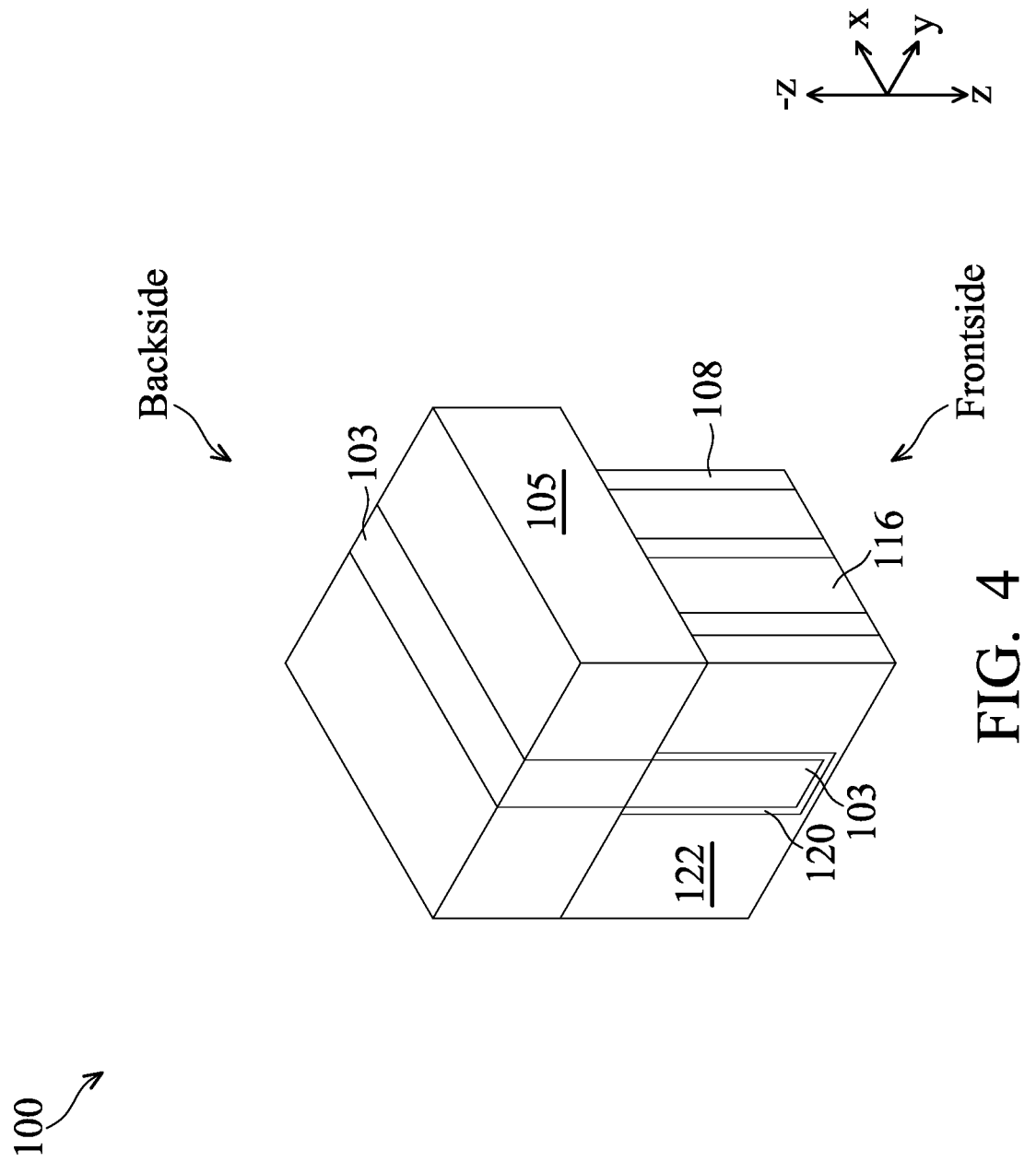
FIGS. 4, 5A, 6A, 7A, 8A, 9A, 10A, and 11A illustrate perspective views of a portion of a semiconductor device, according to some embodiments, in intermediate steps of fabrication according to an embodiment of the method of FIGS. 1A and 1B.

At operation 16, the method 10 (FIG. 1A) thins down the device 100 from the backside of the device 100. The thinning process may include a mechanical grinding process and/or a chemical thinning process. A substantial amount of substrate material may be first removed from the substrate 102 during a mechanical grinding process. Afterwards, a chemical thinning process may apply an etching chemical to the backside of the substrate 102 to further thin down the substrate 102. In the present embodiment, the device 100 is thinned down until the active regions (such as the fins 103) and the isolation structure 105 are exposed from the backside of the device 100, such as shown in FIG. 4. For the purposes of simplicity, FIG. 4 does not show all components of the device 100.

Figure 5A:
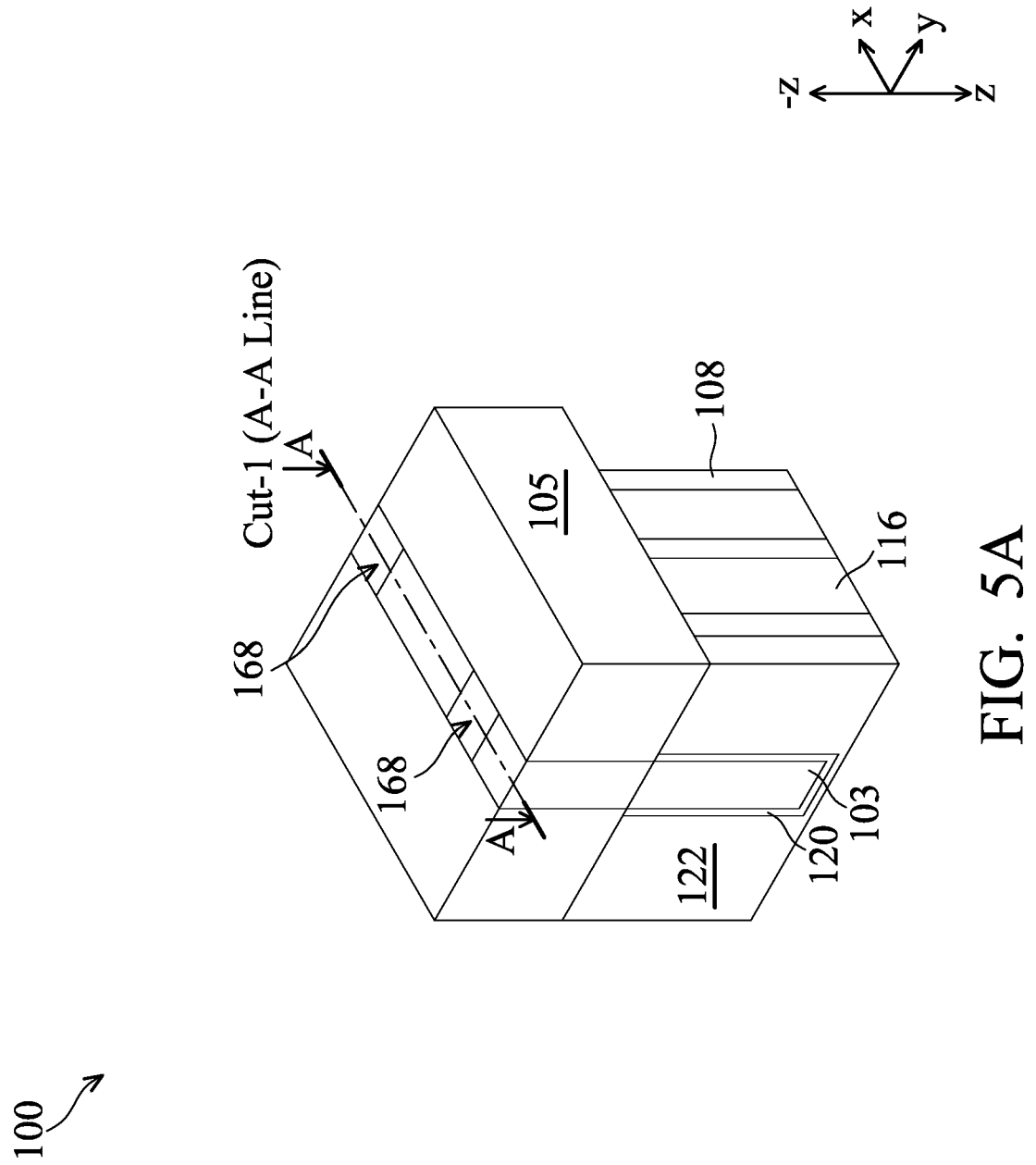

At operation 18, the method 10 (FIG. 1A) etches holes 168 through the active regions (such as the fins 103) to reach some of the S/D features 104 from the backside of the device 100. An example of the device 100 with the holes 168 is shown in FIGS. 5A and 5B where FIG. 5B is a cross-sectional view of the device 100 along the Cut-1 line in FIG. 5A. The Cut-1 line may be the same as the A-A line in FIG. 2C. In an embodiment, the operation 18 may include a variety of processes such as deposition, photolithography, and etching. For example, the operation 18 may form a resist layer over the backside of the device 100 (e.g., by spin coating), perform a pre-exposure baking process, expose the resist using a photomask, perform a post-exposure baking process, and develop the exposed resist layer in a developer solution. After development, the patterned resist layer (or resist pattern) provides openings corresponding to the holes 168. Alternatively, the exposure process can be implemented or replaced by other methods, such as maskless lithography, e-beam writing, ion-beam writing, or combinations thereof. Subsequently, the device 100 is etched through the openings in the resist pattern to form the holes 168. Thereafter, the resist pattern is removed, for example, by stripping. The holes 168 may expose source features, drain features, and/or other features of various transistors and active regions. For example, two adjacent holes 168 may expose a source feature and a drain feature of the same transistor or may expose a source or drain feature of one transistor and another source or drain feature of another transistor. Through the holes 168, a connectivity network may be built on the backside of the device 100 and provides power and/or signal lines to the transistors already formed in the frontside of the device 100.

Figure 6A:
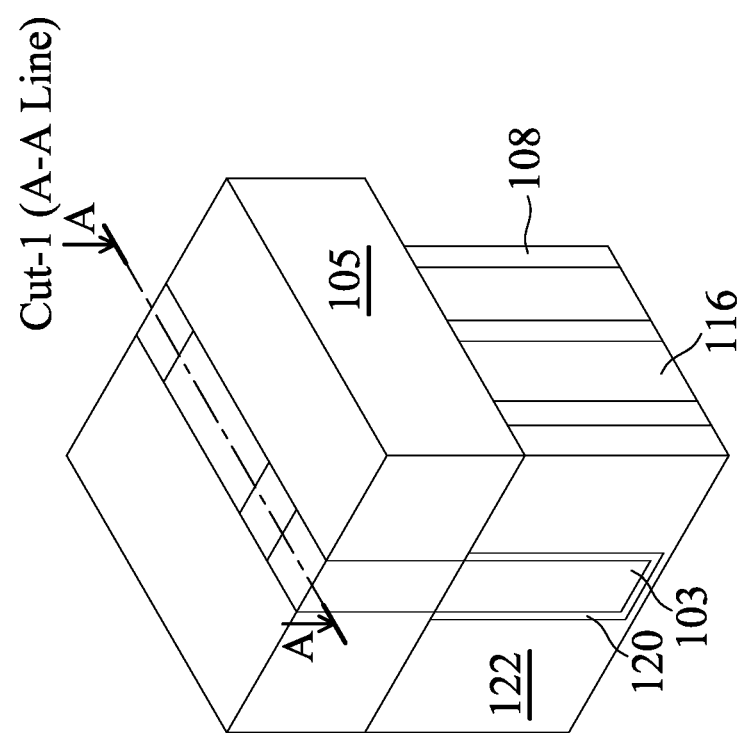

At operation 20, the method 10 (FIG. 1A) forms silicide features 169 in the holes 168 and over the S/D features 104, and form conductors (or metal plugs) 170 in the holes 168 and over the silicide features 169, such as shown in FIGS. 6A and 6B, where FIG. 6B is a cross-sectional view of the device 100 along the Cut-1 line in FIG. 6A. In an embodiment, the operation 20 includes depositing one or more metals into the holes 168, performing an annealing process to the device 100 to cause reaction between the one or more metals and the S/D features 104 to produce the silicide features 169, and removing un-reacted portions of the one or more metals, leaving the silicide features 169 exposed in the holes 168. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide features 169 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the plugs 170 may include a conductive barrier layer on bottom and sidewalls of the holes 168 and a metal fill layer over the conductive barrier layer. The conductive barrier layer functions to prevent metal materials of the metal fill layer from diffusing into a dielectric layer that is to be formed adjacent the plugs 170. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), aluminum (Al), or other metals, and may be formed by CVD, PVD, ALD, plating, or other suitable processes. In some embodiments, the conductive barrier layer is omitted in the plugs 170. The operation 20 may perform a CMP process to remove excessive materials of the plugs 170 and to expose the active regions (the fins 103 in this example) from the backside of the device 100 again.

Figure 7A:
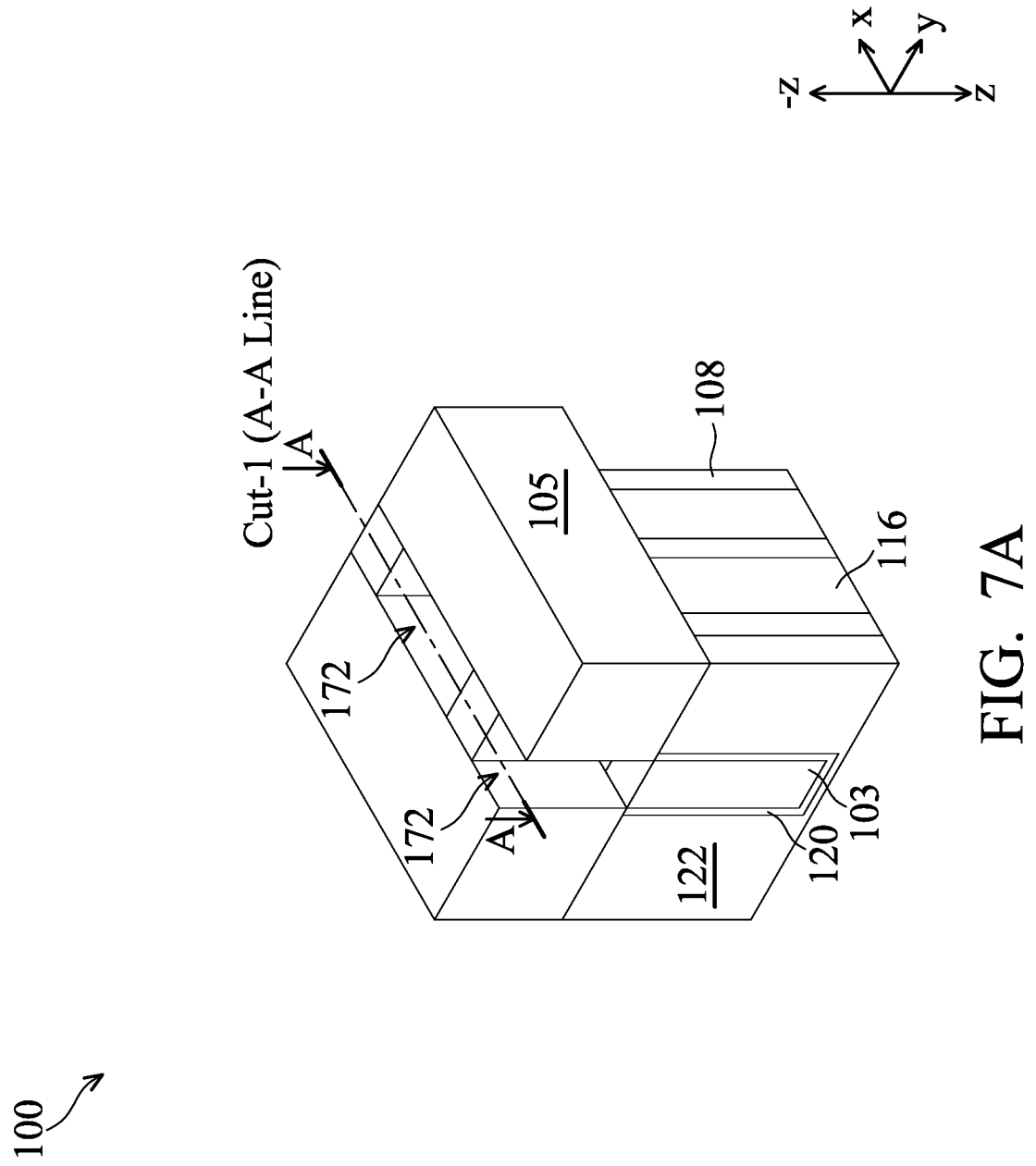
Figure 7B:
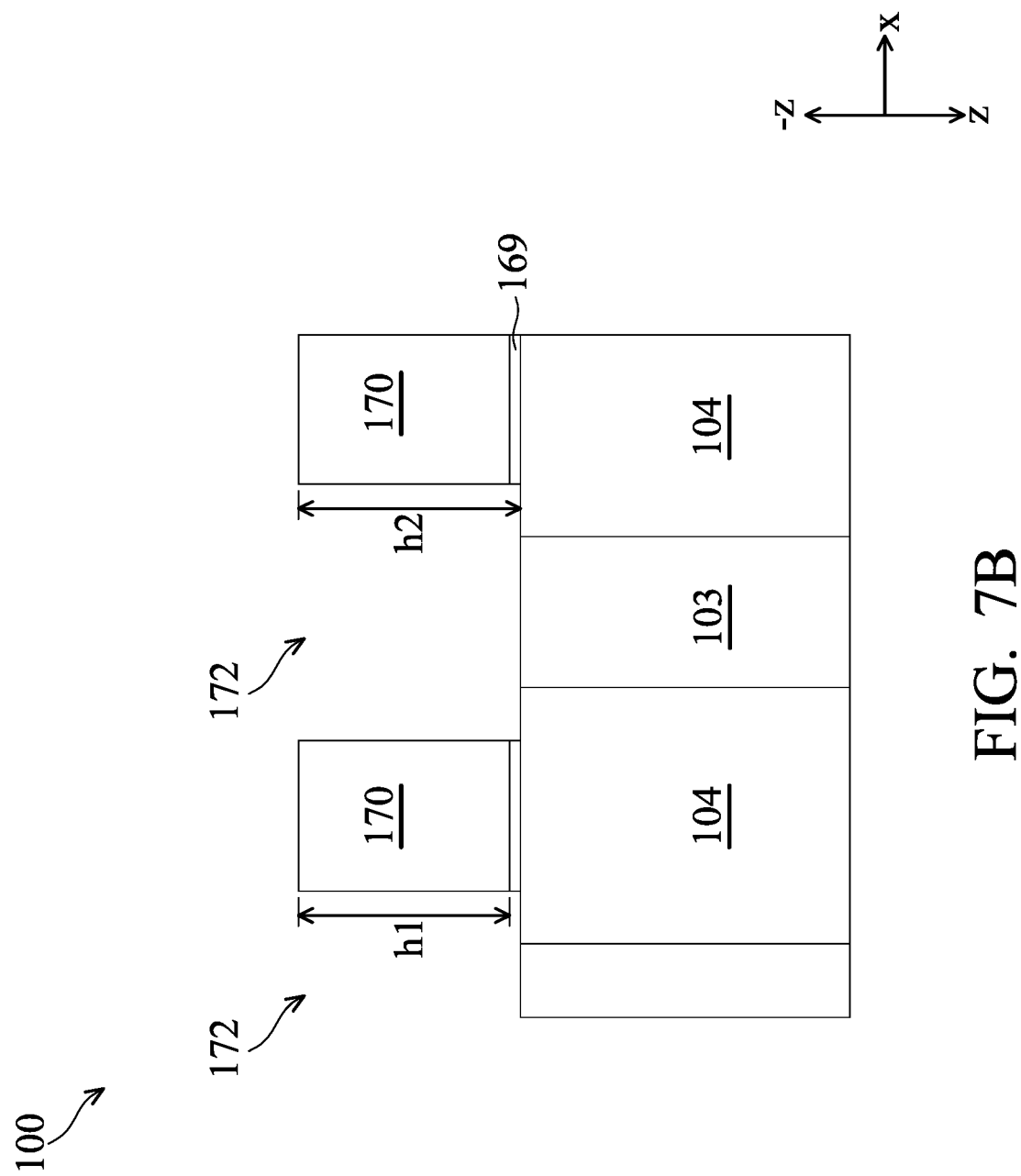

At operation 22, the method 10 (FIG. 1A) etch the active regions 103 (the fins 103) between the plugs 170 to form trenches 172, such as shown in FIGS. 7A and 7B, where FIG. 7B is a cross-sectional view of the device 100 along the Cut-1 line in FIG. 7A. In an embodiment, the operation 22 may etch the active regions 103 using a self-aligned etching process without using an etch mask. For example, the operation 22 may perform an etching process that is tuned selective to the materials of the active regions 103 with no (or minimal) etching to the plugs 170 and the isolation structure 105. In an embodiment, the active regions 103 include an anti-punch-through (APT) layer (not shown) that is above the channel layer (in the "-z" direction), and the operation 22 may partially or completely removes the APT layer. The trenches 172 extend to a depth h2 from the backside of the device 100, where h2 is equal to or greater than a height h1 of the plugs 170 in some embodiments. In some embodiments, the depth h2 is equal to or greater than the height h1 of the plugs 170 and a thickness of the silicide features 169 combined. As shown in FIG. 7A, the isolation structure 105 and the plugs 170 form all or part of the sidewalls of the trenches 172, while the S/D features 104 and the active regions 103 form the bottom of the trenches 172.

At operation 24, the method 10 (FIG. 1B) treats the surfaces of the trenches 172, for example, with a chemical gas, a solution, or a plasma. The treatment pre-conditions the surfaces of the trenches 172 so as to more easily obtain an over-hang profile in a dielectric liner 174 formed in operation 26, to be discussed below. For example, the operation 24 may treat the surfaces of the trenches 172 with a plasma having atoms or ions of nitrogen, fluorine, chlorine, oxygen, hydrogen, and/or argon. For example, the plasma may be generated using $NF_3$, hydrogen-containing fluorocarbon ($CH_xF_y$) such as $CH_3F$, HCl, $CO_2$, $O_2$, $H_2$, and/or Ar. As a result, some of the F, C, Cl, O, Si, and N atoms may be found on the surfaces of the trenches 172. The operation 24 is optional and may be omitted in some embodiments of the method 10.

Figure 8A:
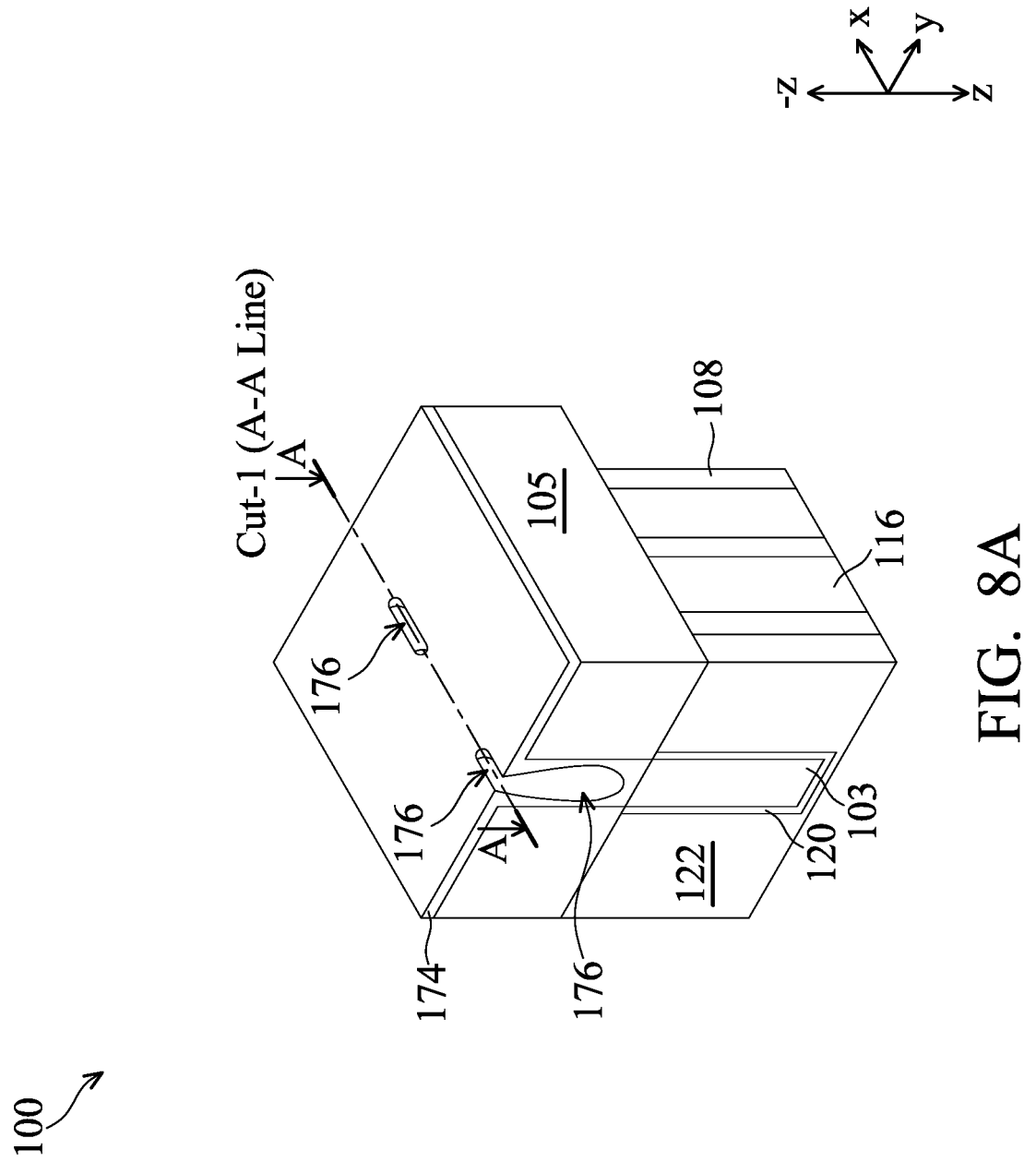
Figure 8B:
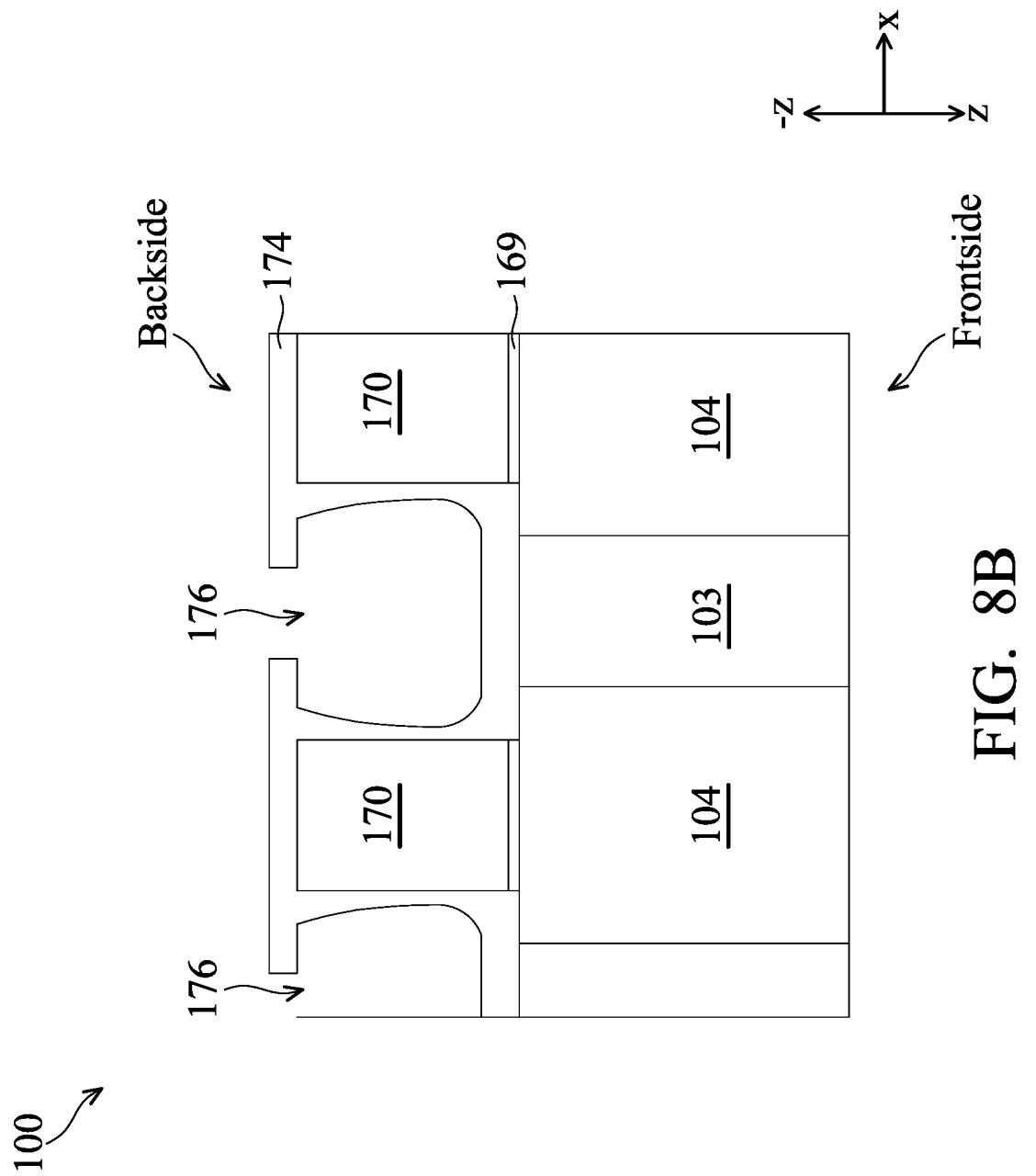

At operation 26, the method 10 (FIG. 1B) deposits a dielectric liner 174 over the isolation structure 105, the plugs 170, and inside the trenches 172, such as shown in FIGS. 8A and 8B, where FIG. 8B is a cross-sectional view of the device 100 along the Cut-1 line in FIG. 8A. Particularly, the dielectric liner 174 is formed to have an over-hang profile. In other words, the thickness of the dielectric liner 174 is greater at the opening of the trenches 172 that is proximal the backside of the device 100 than inside the trench 172 that is distal the backside of the device 100. As a result, the opening of the trenches 172 may be closed off (or nearly closed off) by the dielectric liner 174. Furthermore, the dielectric liner 174 is deposited on the bottom and sidewalls of the trenches 172 and does not fully fill the trenches 172. An air gap (or a void or an air pocket) 176 is formed inside each of the trenches 172. The air gap 176 may be fully enclosed (or fully sealed) by the dielectric liner 174 alone in some embodiment or may be partially enclosed (or partially sealed) by the dielectric liner 174. In various embodiments, the dielectric liner 174 may include a low-k dielectric material having Si, O, N, and C, or other porous low dielectric constant materials. The dielectric liner 174 may be configured to have a single layer or multiple layers.

In an embodiment, the dielectric liner 174 is deposited using a chemical vapor deposition process, such as a plasma enhanced chemical vapor deposition (PECVD) process. For example, the PECVD process may apply plasma generated from $SiH_4$ gas, $N_2$ gas, $NH_3$ gas, and/or other gases, which deposit the dielectric liner 174. Various parameters of the PECVD process may be tuned to create the over-hang profile in the dielectric liner 174. For example, the composition of the deposition gases, the ratio among the deposition gases, the process pressure, the process temperature, the AC or DC power, or other parameters of the PECVD process may be tuned. In an example, the ratio of $SiH_4$ gas to the $N_2$ or $NH_3$ gas may be tuned in the range of about 5 to about 200, the process pressure may be tuned in the range of about 300 mT to about 800 mT, and the process temperature may be tuned in the range of about 200° C. to about 400° C., such as about 300° C. to about 400° C. The range of the process temperature is selected high enough to deposit the dielectric liner 174, yet low enough to protect various features at the frontside of the device 100 such as the metal components in the device 100.

Figure 9A:
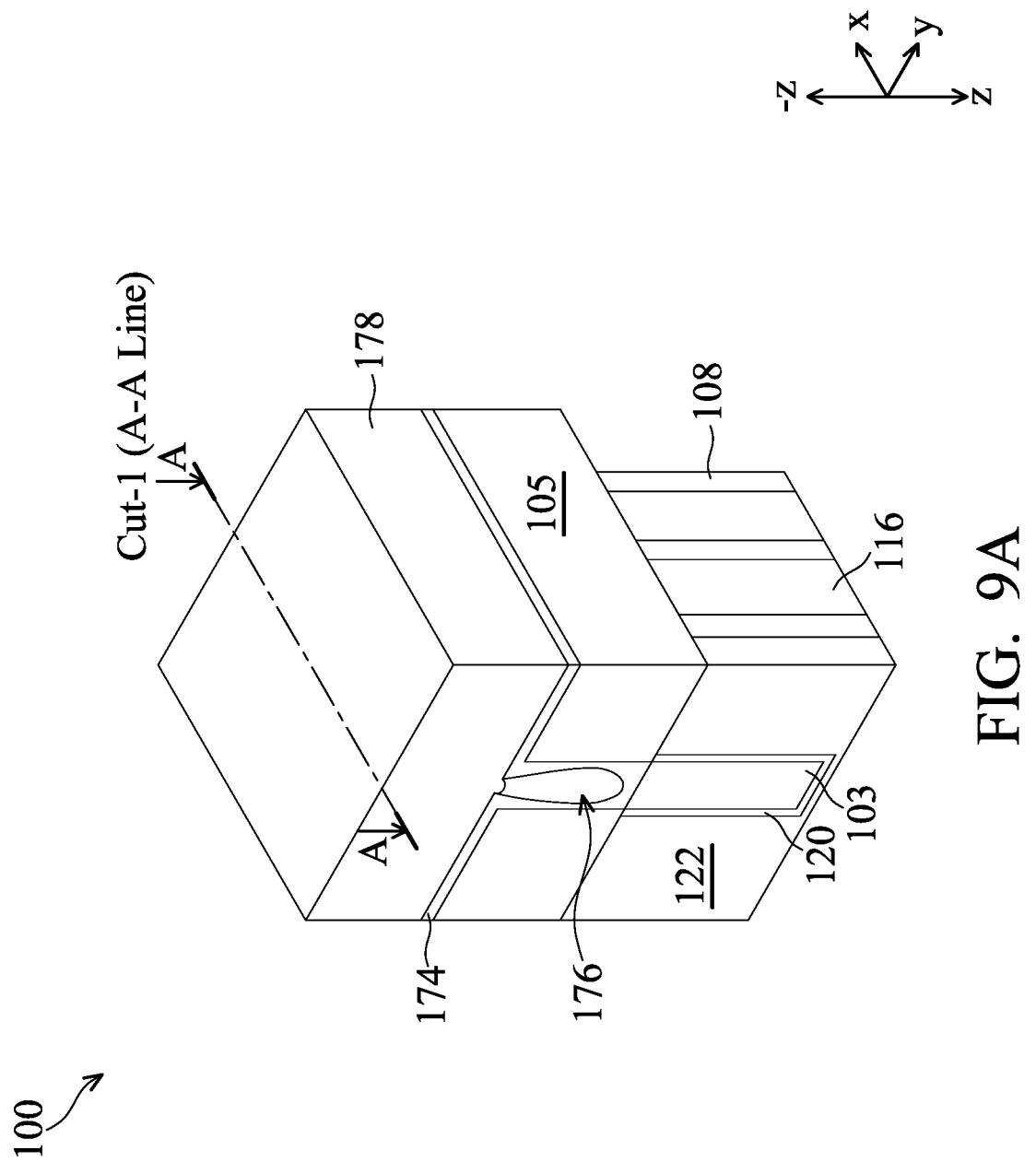

At operation 28, the method 10 (FIG. 1B) deposits a dielectric layer 178 over the dielectric liner 174, such as shown in FIGS. 9A and 9B, where FIG. 9B is a cross-sectional view of the device 100 along the Cut-1 line in FIG. 9A. The dielectric layer 178 will be removed in a later step. Thus, it is also referred to as a sacrificial dielectric layer 178. As shown in FIG. 8A and 8B, a portion of the dielectric liner 174 is deposited on top of the isolation structure 105 and the plugs 170. It is desirable to remove this portion of the dielectric liner 174 using a CMP process in the present embodiment. However, this portion of the dielectric liner 174 may be too thin to be suitable for a CMP process. For this reason, the dielectric layer 178 is deposited to increase the total thickness of the layers subject to a CMP process. The dielectric layer 178 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The dielectric layer 178 may be formed by PECVD, or other suitable methods. Particularly, the dielectric layer 178 does not fill in the air gap 176 (except the very top portion of the air gap 176 if it not fully sealed by the dielectric liner 174) due to the over-hang profile of the dielectric liner 174.

Figure 10A:
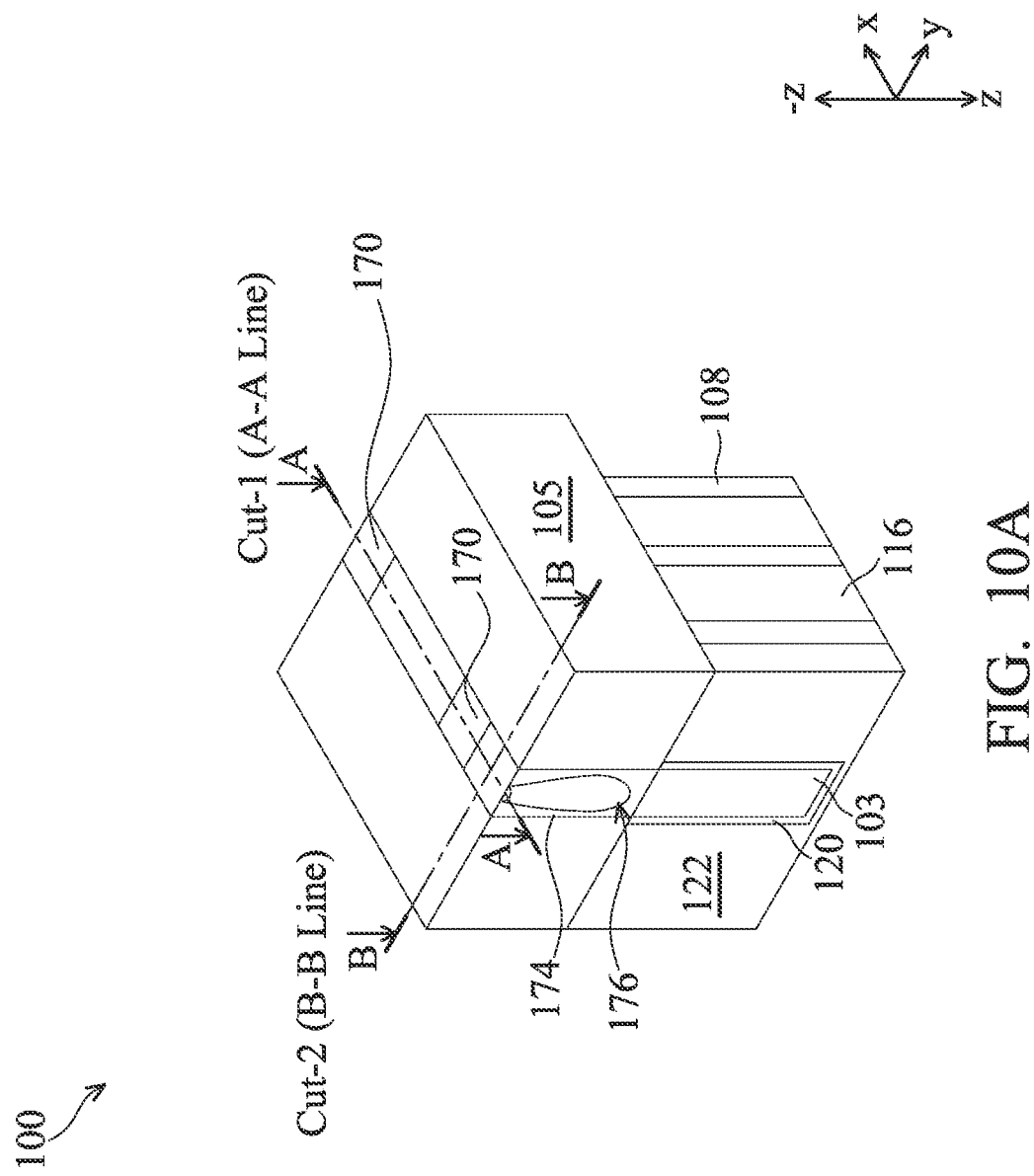
Figure 10B:
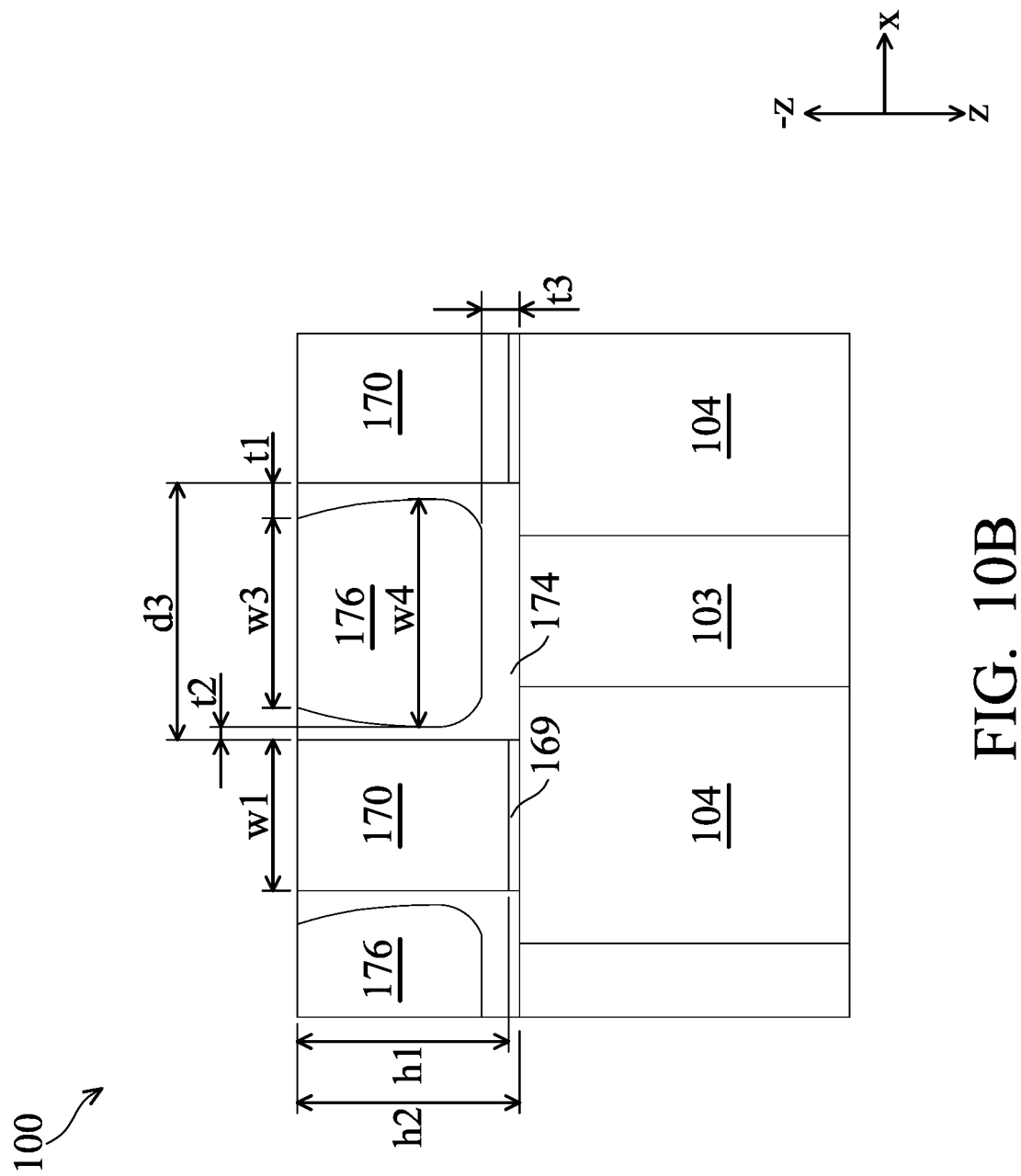
Figure 10C:
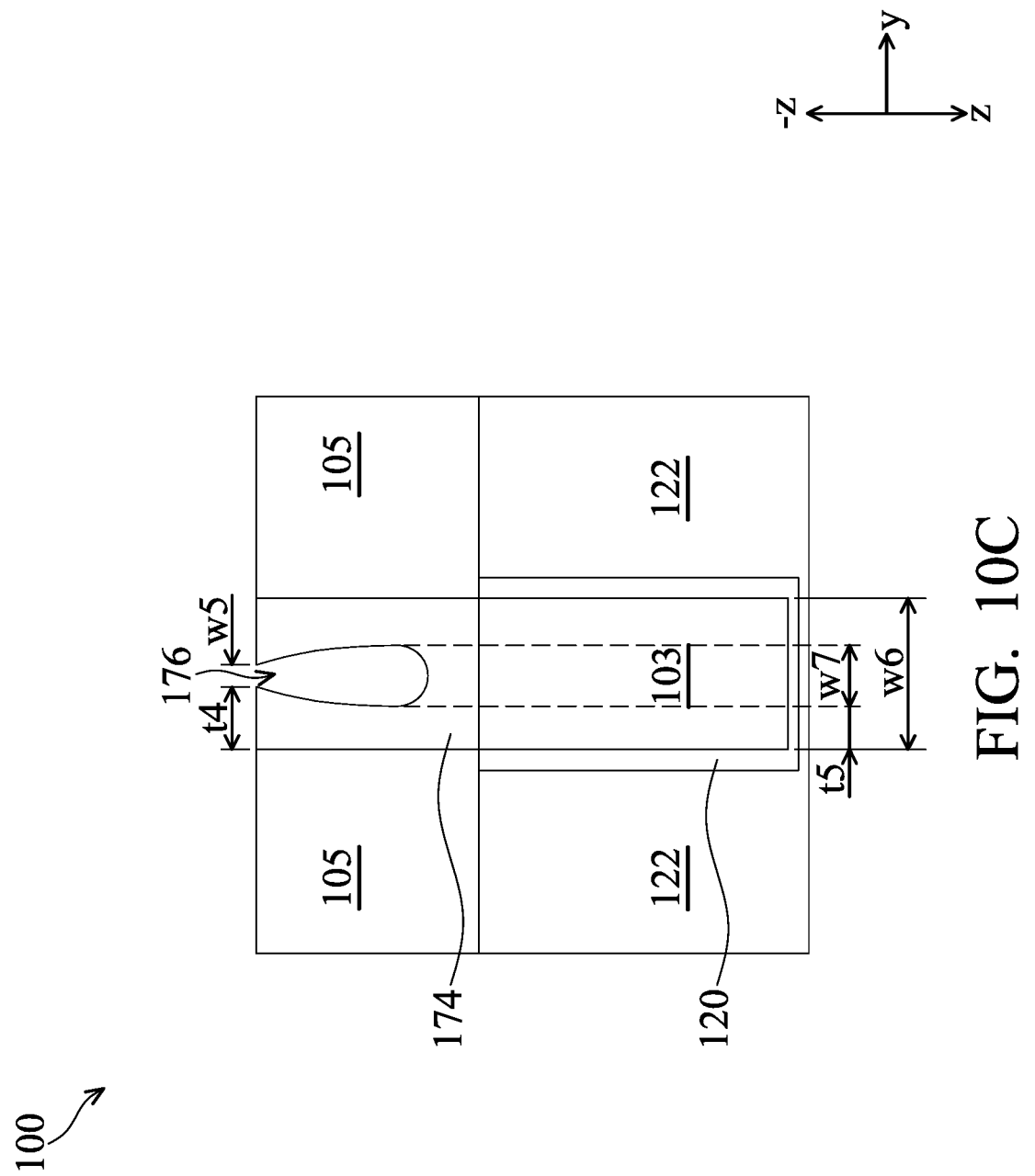
FIG. 10C illustrates a cross-sectional view of a portion of a semiconductor device along the Cut-2 line in FIG. 10A, according to some embodiments.

At operation 30, the method 10 (FIG. 1B) performs a CMP process to completely remove the dielectric layer 178 and the portion of the dielectric liner 174 that is deposited on top of the isolation structure 105 and the plugs 170. As a result, the isolation structure 105 and the plugs 170 are exposed, such as shown in FIGS. 10A, 10B, and 10C, where FIGS. 10B and 10C are cross-sectional views of the device 100 along the Cut-1 line and the Cut-2 line in FIG. 10A respectively. In an embodiment, the CMP process may use the plugs 170 and/or the isolation structure 105 for CMP end-point detection. FIGS. 10B and 10C also illustrate various dimensions of the dielectric liner 174, the plugs 170, and the air gap 176.

Referring to FIGS. 10B and 10C, in some embodiments, the plugs 170 may have a height h1 in a range of about 5 nm to about 50 nm, a length w1 in a range of about 5 nm to about 500 nm, a width w6 (which is also the width of the trench 168 in FIG. 5A) in a range of about 5 nm to about 500 nm. The distance d3 between two adjacent plugs 170 may be in a range of about 10 nm to about 500 nm in some embodiments. As discussed earlier, the height h2 of the trench 168 is equal to or greater than the height h1 of the plugs 170. Also, the distance d3 is greater than the width of the active region 103. This ensures that the plugs 170 are isolated from the active region 103 by the dielectric liner 174 and the air gap 176.

Referring to FIG. 10B, in various embodiments, the dielectric liner 174 may have a thickness t1 (at the top surface of the dielectric liner 174) that is less than 10 nm, such as in a range of about 0.5 nm to about 10 nm. In various embodiments, the dielectric liner 174 may have a thickness t2 (in the middle or bottom portion of the dielectric liner 174) that is less than 10 nm, such as in a range of about 0.5 nm to about 10 nm. Further, the thickness t2 is less than t1 in the present embodiment. The thicknesses t1 and t2 are measured along the "x" direction. Still further, the dielectric liner 174 may have a thickness t3 (in the bottom portion of the dielectric liner 174, measured along the "z" direction) that is less than 10 nm, such as in a range of about 0.5 nm to about 10 nm.

Referring to FIG. 10C, in various embodiments, the dielectric liner 174 may have a thickness t4 (at the top surface of the dielectric liner 174) that is less than 10 nm, such as in a range of about 0.5 nm to about 10 nm. In various embodiments, the dielectric liner 174 may have a thickness t5 (in the middle or bottom portion of the dielectric liner 174) that is less than 10 nm, such as in a range of about 0.5 nm to about 10 nm. Further, the thickness t5 is less than t4 in the present embodiment. The thicknesses t4 and t5 are measured along the "y" direction.

In the above discussion, the upper limit in the thicknesses t1, t2, t3, t4, and t5 (e.g., about 10 nm) is selected so that there is enough room left for the air gap 176 in the trench 172. Because air has a lower dielectric constant than the material of the dielectric liner 174, having a larger air gap 176 beneficially reduces the stray capacitance between the plugs 170. The dielectric liner 174 can be made as thin as possible, depending on the deposition technology, yet still thick enough to produce the over-hang profile as discussed earlier.

Referring to FIGS. 10B and 10C, the air gap 176 has a top opening width w3 along the "x" direction and a top opening width w5 along the "y" direction. In some embodiments, each of the w3 and w5 may be in a range of 0 nm (i.e., the air gap 176 is fully enclosed by the dielectric liner 174 alone) to about 500 nm (for example, the CMP process in the operation 30 may expose a wide opening of the air gap 176).

Further, the air gap 176 has a width w4 along the "x" direction and a width w7 along the "y" direction in the belly portion of the air gap 176. In the present embodiment, w3 is less than w4, and w5 is less than w7.

Figure 11A:
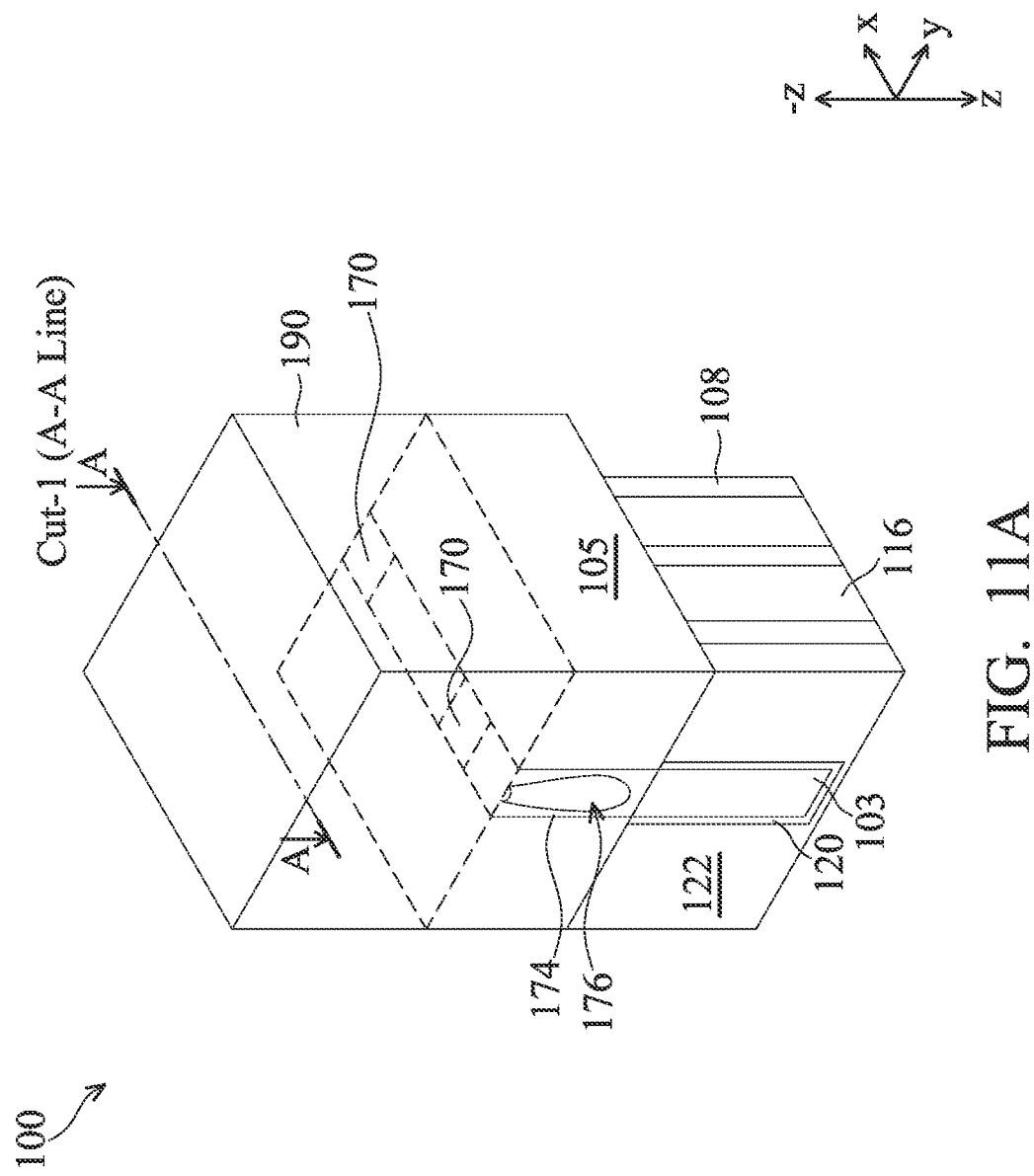
Figure 11B:
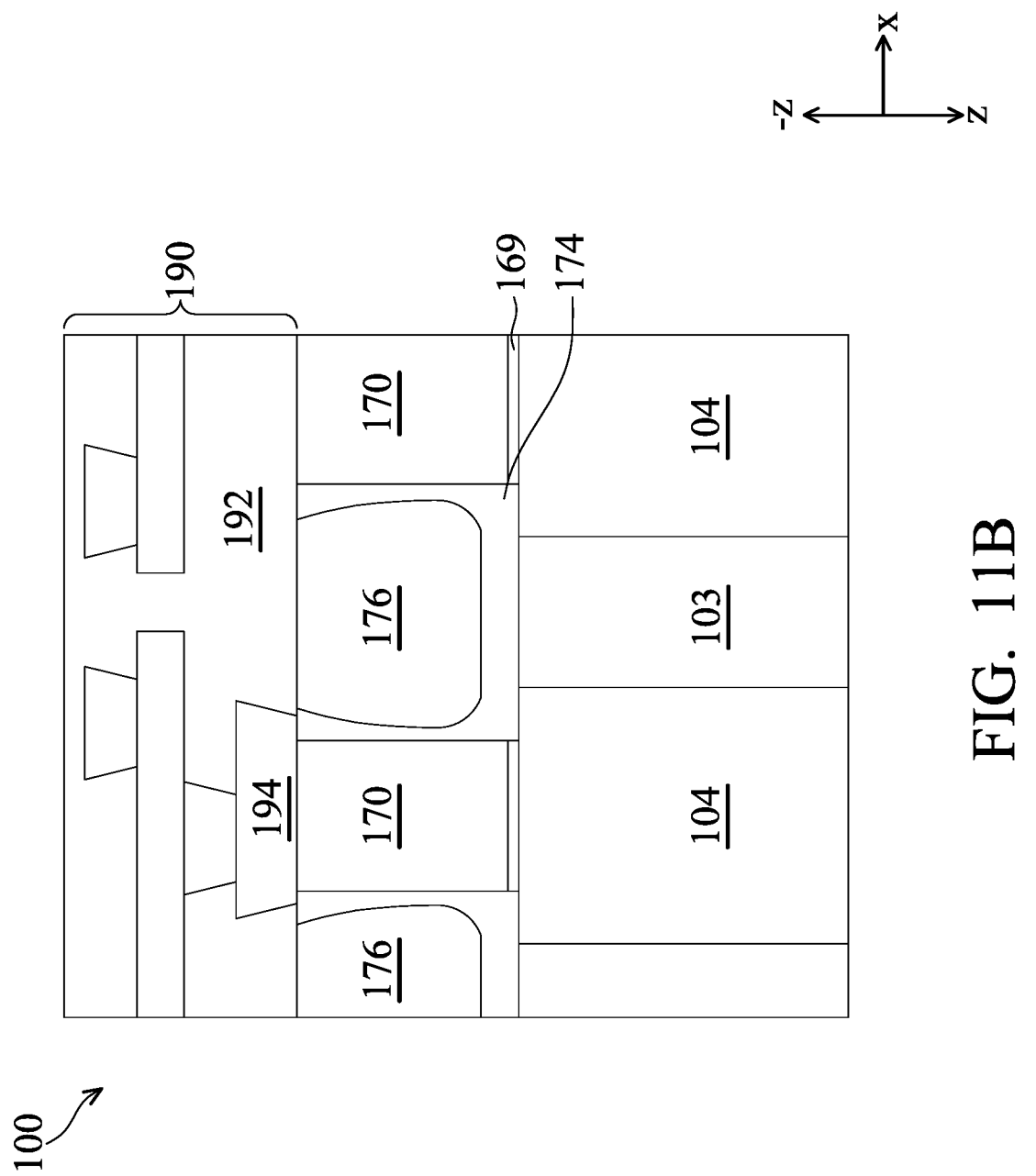
Figures 1, 11B:
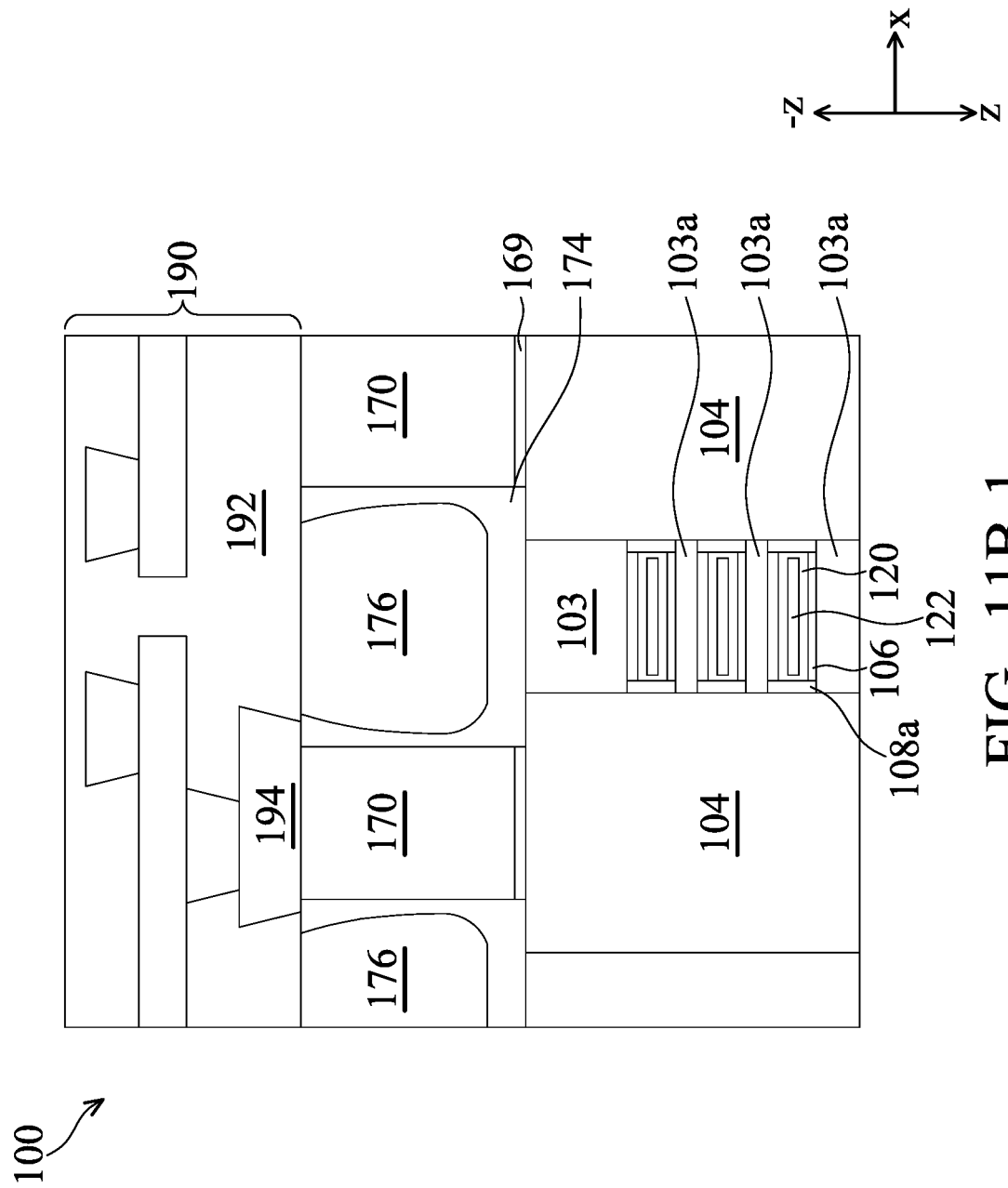

At operation 32, the method 10 (FIG. 1B) performs further fabrications to the backside of the device 100. For example, it may form an interconnect structure 190 over the isolation structure 105, the plugs 170, the dielectric liner 174, and the air gap 176. An example is shown in FIGS. 11A and 11B, where FIG. 11B is a cross-sectional view of the device 100 along the Cut-1 line in FIG. 11A. Referring to FIGS. 11A and 11B, the interconnect structure 190 includes conductors (such as metal lines and via) 194 embedded in one or more dielectric layers 192. The configuration of the interconnect structure 190 may be similar to that of the interconnect structure 162 (FIG. 2B). Particularly, the composition and formation of the conductors 194 and the dielectric layers 192 may be the same as those of the conductors 166 and the dielectric layers 164, respectively. In embodiments where the air gaps 176 are not fully sealed by the dielectric liner 174, they are fully sealed by the dielectric liner 174 and the dielectric layers 192 collectively. Further, structures similar to the dielectric liner 174 and the air gap 176 may be formed in the interconnect structure 190, such as between some of the conductors 194. FIG. 11B-1 illustrates an embodiment of the device 100 with GAA FETs after the device 100 has undergone the operations 14 through 32. As illustrated, the dielectric liner 174 and the air gap 176 are disposed over the active region 103 and the channel layers 103a. Other aspects of FIG. 11B-1 are the same as those in FIG. 11B. After the backside of the device 100 has been processed, the method 10 may remove the carrier substrate 220 (FIG. 3).

Although not intended to be limiting, embodiments of the present disclosure provide one or more of the following advantages. For example, embodiments of the present disclosure form a dielectric liner with an air gap at the backside of a wafer. The dielectric liner and the air gap effectively reduce the stray capacitance between adjacent conductors and increase the isolation thereof. Also, the air gap can also reduce or eliminate metal leakage to and from the conductors, thereby increasing long-term reliability of the device. Embodiments of the present disclosure can be readily integrated into existing semiconductor manufacturing processes.

In one example aspect, the present disclosure is directed to a method that includes providing a structure having transistors, an isolation structure that is at least partially over the transistors, two metal plugs through the isolation structure and electrically connecting to electrodes of the transistors, and a trench, wherein the isolation structure and the two metal plugs form sidewalls of the trench. The method further includes forming a dielectric liner on the sidewalls of the trench and over the isolation structure and the metal plugs, wherein the dielectric liner is thicker at an opening portion of the trench than at another portion of the trench that is deeper than the opening portion so that an air gap is formed inside the trench and the air gap is fully or partially surrounded by the dielectric liner. The method further includes depositing a sacrificial dielectric layer over the dielectric liner and over the air gap and performing a chemical-mechanical planarization (CMP) process to remove the sacrificial dielectric layer and to recess the dielectric liner until the isolation structure and the metal plugs are exposed, wherein the air gap remains inside the trench.

In some embodiments, the method further includes forming a dielectric layer over the isolation structure, the dielectric liner, the air gap, and the metal plugs, wherein the air gap is sealed by the dielectric liner alone or by both the dielectric liner and the dielectric layer; and forming conductors in the dielectric layer, wherein the conductors are electrically connected to the metal plugs.

In some embodiments of the method, the forming of the dielectric liner includes using plasma enhanced chemical vapor deposition (PECVD). In further embodiments, the PECVD includes applying plasma generated from $SiH_4$ gas and $N_2$ or $NH_3$ gas.

In some embodiments, before the forming of the dielectric liner, the method further includes treating the sidewalls of the trench with a plasma having atoms of nitrogen, fluorine, chlorine, oxygen, hydrogen, or argon.

In some embodiments of the method, the providing of the structure includes receiving a workpiece having a substrate with active regions, wherein the isolation structure isolates the active regions, and the transistors are formed over the active regions, the workpiece further having an interconnect structure over the transistors, wherein the substrate is at a backside of the workpiece and the interconnect structure is at a frontside of the workpiece. The providing of the structure further includes attaching the frontside of the workpiece to a carrier wafer; thinning the workpiece from the backside of the workpiece until the isolation structure and the active regions are exposed from the backside of the workpiece; etching two holes through the active regions to expose the electrodes of the transistors from the backside of the workpiece; forming the two metal plugs in the two holes respectively; and etching the active regions between the two metal plugs from the backside of the workpiece, thereby forming the trench. In a further embodiment, the transistors include FinFETs and the active regions include semiconductor fins. In another further embodiment, the transistors include gate-all-around FETs and the active regions include semiconductor fins.

In some embodiments of the method, the trench is as deep as or deeper than the metal plugs.

In another example aspect, the present disclosure is directed to a method that includes providing a structure having a silicon substrate, an isolation structure over the silicon substrate, one or more semiconductor fins extending from the silicon substrate and over the isolation structure, one or more transistors formed over the one or more semiconductor fins, and an interconnect structure over the one or more transistors, wherein the silicon substrate is at a backside of the structure and the interconnect structure is at a frontside of the structure. The method further includes attaching the frontside of the structure to a carrier substrate; thinning the structure from the backside of the structure until the isolation structure and the one or more semiconductor fins are exposed from the backside of the structure; etching two holes through the one or more semiconductor fins to expose two source/drain features of the one or more transistors from the backside of the structure; forming two metal plugs in the two holes respectively; etching the one or more semiconductor fins between the two metal plugs from the backside of the structure, thereby forming a trench; and forming a dielectric liner on sidewalls of the trench and over the isolation structure and the metal plugs, wherein the dielectric liner is thicker at an opening portion of the trench than at another portion of the trench that is deeper than the opening portion so that an air gap is formed inside the trench.

In some embodiments of the method, the trench is as deep as or deeper than the metal plugs from the backside of the structure. In some embodiments, the air gap is fully surrounded by the dielectric liner alone.

In some embodiments, the method further includes depositing a sacrificial dielectric layer over the dielectric liner and over the air gap and performing a chemical-mechanical planarization (CMP) process to remove the sacrificial dielectric layer and to recess the dielectric liner until the isolation structure and the metal plugs are exposed, wherein the air gap remains inside the trench. In a further embodiment, after the performing of the CMP process, the method further includes forming another interconnect structure over the backside of the structure and over the dielectric liner, the air gap, and the metal plugs.

In some embodiments of the method, the forming of the dielectric liner includes using plasma enhanced chemical vapor deposition (PECVD) with plasma generated from $SiH_4$ gas and $NH_3$ gas.

In yet another example aspect, the present disclosure is directed to a semiconductor structure having a frontside and a backside. The semiconductor structure includes an isolation structure at the backside; one or more transistors over the isolation structure and at the frontside, the one or more transistors having source/drain electrodes; a first interconnect structure over the one or more transistors and at the frontside; two metal plugs through the isolation structure and contacting two of the source/drain electrodes from the backside, wherein the two metal plugs and the isolation structure form sidewalls of a trench; and a dielectric liner on the sidewalls of the trench, wherein the dielectric liner partially or fully surrounds an air gap within the trench.

In some embodiments, the semiconductor structure further includes a second interconnect structure over the two metal plugs and at the backside. In some embodiments, the dielectric liner is thicker at an opening portion of the trench than at another portion of the trench that is deeper than the opening portion oriented from the backside to the frontside. In some embodiments, the dielectric liner has a thickness of less than 10 nm on the sidewalls of the trench. In some embodiments, the dielectric liner directly contacts the two of the source/drain electrodes.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure having a frontside and a backside, comprising:
    an isolation structure at the backside;
    one or more transistors at the frontside, the one or more transistors having source/drain electrodes;
    two metal plugs through the isolation structure and contacting two of the source/drain electrodes from the backside, wherein the two metal plugs and the isolation structure form sidewalls of a trench; and
    a dielectric liner on the sidewalls of the trench, wherein the dielectric liner partially or fully surrounds an air gap within the trench.

2. The semiconductor structure of claim 1, wherein the dielectric liner is thicker at an opening portion of the trench than at another portion of the trench that is deeper than the opening portion when viewed from the backside to the frontside.

3. The semiconductor structure of claim 1, wherein the dielectric liner partially surrounds the air gap, further comprising:
an interconnect structure over the dielectric liner and the metal plugs and at the backside, wherein the interconnect structure and the dielectric liner collectively fully surround the air gap.

4. The semiconductor structure of claim 1, wherein the dielectric liner includes a low-k dielectric material having Si, O, N, and C.

5. The semiconductor structure of claim 1, wherein the air gap has a middle portion that is wider than both a topmost portion and a bottommost portion in a cross-section view cut along a first direction from one of the two metal plugs to another one of the two metal plugs.

6. The semiconductor structure of claim 5, wherein the middle portion is also wider than both the topmost portion and the bottommost portion in another cross-section view cut along a second direction perpendicular to the first direction.

7. The semiconductor structure of claim 6, wherein the dielectric liner has a thickness less than 10 nm.

8. The semiconductor structure of claim 1, wherein the dielectric liner fully surrounds the air gap.

9. The semiconductor structure of claim 8, further comprising an interconnect structure over the dielectric liner and the metal plugs and at the backside.

10. A semiconductor structure having a frontside and a backside, comprising:
an isolation structure at the backside;
one or more transistors at the frontside, the one or more transistors having source/drain electrodes;
a first interconnect structure over the one or more transistors and at the frontside;
two metal plugs through the isolation structure and contacting two of the source/drain electrodes from the backside, wherein the two metal plugs and the isolation structure form sidewalls of a trench;
a dielectric liner on the sidewalls of the trench; and
a second interconnect structure over the dielectric liner and the metal plugs and at the backside, wherein the second interconnect structure and the dielectric liner surround an air gap within the trench.

11. The semiconductor structure of claim 10, wherein a middle portion of the dielectric liner is thinner than both a topmost portion and a bottommost portion of the dielectric liner.

12. The semiconductor structure of claim 11, wherein the middle portion of the dielectric liner has a thickness in a range from about 0.5 nm to about 10 nm.

13. The semiconductor structure of claim 12, wherein the dielectric liner includes a porous dielectric material.

14. The semiconductor structure of claim 11, wherein the trench has a width in a range from about 5 nm to about 500 nm and a length in a range from about 10 nm to about 500 nm.

15. The semiconductor structure of claim 10, wherein the two metal plugs contact the two of the source/drain electrodes through silicide layers.

16. A semiconductor structure having a frontside and a backside, comprising:
an isolation structure at the backside;
one or more transistors at the frontside, the one or more transistors having source/drain electrodes;
two metal plugs through the isolation structure and contacting two of the source/drain electrodes from the backside;
a dielectric liner on sidewalls of the metal plugs and the isolation structure;
a first interconnect structure over the dielectric liner and the metal plugs and at the backside; and
an air gap at least partially surrounded by the dielectric liner, wherein a first portion of the air gap facing the backside is narrower than a second portion of the air gap that is closer to the frontside than the first portion.

17. The semiconductor structure of claim 16, further comprising:
a second interconnect structure over the one or more transistors and at the frontside.

18. The semiconductor structure of claim 16, wherein a first portion of the dielectric liner is thicker than a second portion of the dielectric liner, wherein the first portion of the dielectric liner is more towards the backside than the second portion of the dielectric liner.

19. The semiconductor structure of claim 16, wherein the dielectric liner has a thickness of less than 10 nm on the sidewalls of the sidewalls of the metal plugs and the isolation structure.

20. The semiconductor structure of claim 16, wherein the dielectric liner directly contacts the two of the source/drain electrodes.

* * * * *